(12) United States Patent
Cao et al.

(10) Patent No.: US 12,207,504 B2
(45) Date of Patent: Jan. 21, 2025

(54) DISPLAY PANEL AND DISPLAY DEVICE

(71) Applicant: Hubei Yangtze Industrial Innovation Center of Advanced Display Co., LTD., Wuhan (CN)

(72) Inventors: Leilei Cao, Wuhan (CN); Jiaxian Liu, Shanghai (CN); Ping An, Shanghai (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 657 days.

(21) Appl. No.: 17/451,973

(22) Filed: Oct. 22, 2021

(65) Prior Publication Data

US 2022/0140043 A1 May 5, 2022

(30) Foreign Application Priority Data

Oct. 30, 2020 (CN) .......................... 202011193885.3

(51) Int. Cl.
*H01L 27/14* (2006.01)
*H01L 27/12* (2006.01)
*H10K 59/126* (2023.01)

(52) U.S. Cl.
CPC ......... *H10K 59/126* (2023.02); *H01L 27/124* (2013.01); *H01L 27/1255* (2013.01); *H01L 27/1225* (2013.01)

(58) Field of Classification Search
CPC ............ H10K 59/126; H10K 59/80522; H01L 27/124; H01L 27/1255; H01L 27/1225; H01L 27/1222
USPC ....................................... 257/59, 72
See application file for complete search history.

(56) References Cited

U.S. PATENT DOCUMENTS 11,171,246 B2 * 11/2021 Park .................... H01L 29/4908

FOREIGN PATENT DOCUMENTS

| CN | 108767016 A | 11/2018 |
|---|---|---|
| CN | 109638078 A | 4/2019 |
| CN | 110211975 A | 9/2019 |
| CN | 110729313 A | 1/2020 |
| JP | 2015167189 A | 9/2015 |

* cited by examiner

*Primary Examiner* — Tan N Tran
(74) *Attorney, Agent, or Firm* — Anova Law Group, PLLC

(57) ABSTRACT

A display panel and a display device are provided. The display panel includes a substrate, a driving circuit, and a first light blocking layer. The driving circuit includes an oxide transistor and a silicon transistor disposed at the substrate. The oxide transistor includes a first active layer. An orthographic projection of the first light blocking layer on the substrate at least overlaps an orthographic projection of the first active layer on the substrate.

15 Claims, 28 Drawing Sheets

DISPLAY PANEL AND DISPLAY DEVICE

CROSS-REFERENCE TO RELATED APPLICATION

This application claims the priority of Chinese Patent Application No. 202011193885.3, filed on Oct. 30, 2020, the content of which is incorporated herein by reference in its entirety.

TECHNICAL FIELD

The present disclosure generally relates to the field of display technologies and, more particularly, relates to a display panel and a display device.

BACKGROUND

As display technologies advance, users may demand higher and higher display performance of display devices. In a display device, a driving circuit is usually used to control a light-emitting element to emit light. The driving circuit includes transistors. If the transistors are unstable, the display performance of the display device will be affected.

Therefore, how to improve the stability of the transistors becomes an urgent technical problem to be solved.

SUMMARY

One aspect of the present disclosure provides a display panel. The display panel includes a substrate, a driving circuit, and a first light blocking layer. The driving circuit includes an oxide transistor and a silicon transistor disposed at the substrate. The oxide transistor includes a first active layer. An orthographic projection of the first light blocking layer on the substrate at least overlaps an orthographic projection of the first active layer on the substrate.

Another aspect of the present disclosure provides a display device. The display device includes a display panel. The display panel includes a substrate, a driving circuit, and a first light blocking layer. The driving circuit includes an oxide transistor and a silicon transistor disposed at the substrate. The oxide transistor includes a first active layer. An orthographic projection of the first light blocking layer on the substrate at least overlaps an orthographic projection of the first active layer on the substrate.

Other aspects or embodiments of the present disclosure can be understood by those skilled in the art in light of the description, the claims, and the drawings of the present disclosure.

In the display panel and display device provided by various embodiments of the present disclosure, the first light blocking layer may be provided and the orthographic projection of the first light blocking layer on the substrate may at least overlap the orthographic projection of the first active layer on the substrate. The first light blocking layer may prevent the light from irradiating the first active layer. Correspondingly, the leakage current may be avoided in the active layer. The stability of the oxide transistor and the display quality of the display panel may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
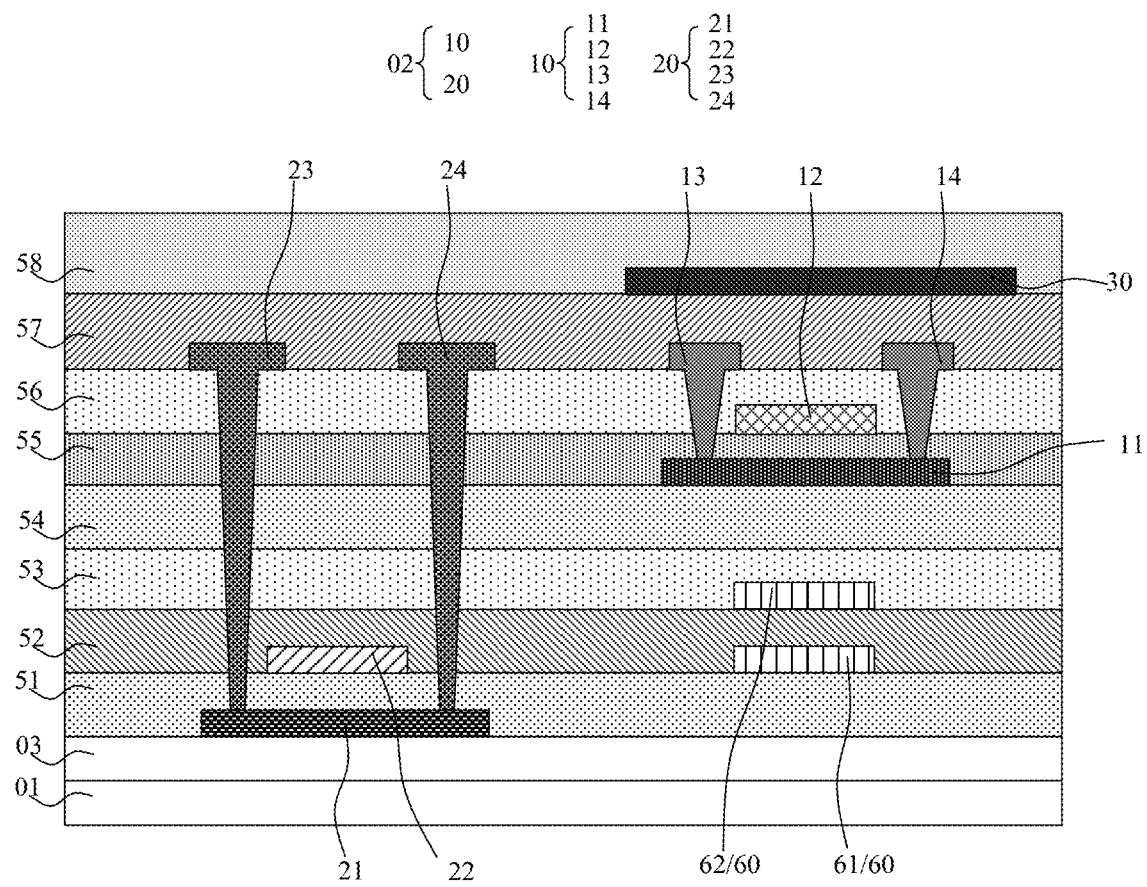
FIG. 1 illustrates an exemplary display panel consistent with various disclosed embodiments of the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

A driving circuit is usually disposed in a display device to control a light-emitting element in the display device to emit light and display. The driving circuit usually includes transistors. After an active layer of one of the transistors is irradiated by light, a leakage current will occur, which affects the stability of the transistor and further affects the display effect of the display panel.

The present disclosure provides a display panel and a display device to at least partially alleviate above problems.

The display panel provided by the present disclosure may be an organic light-emitting diode (OLED) display panel, and may be implemented in different forms.

Figure 2:
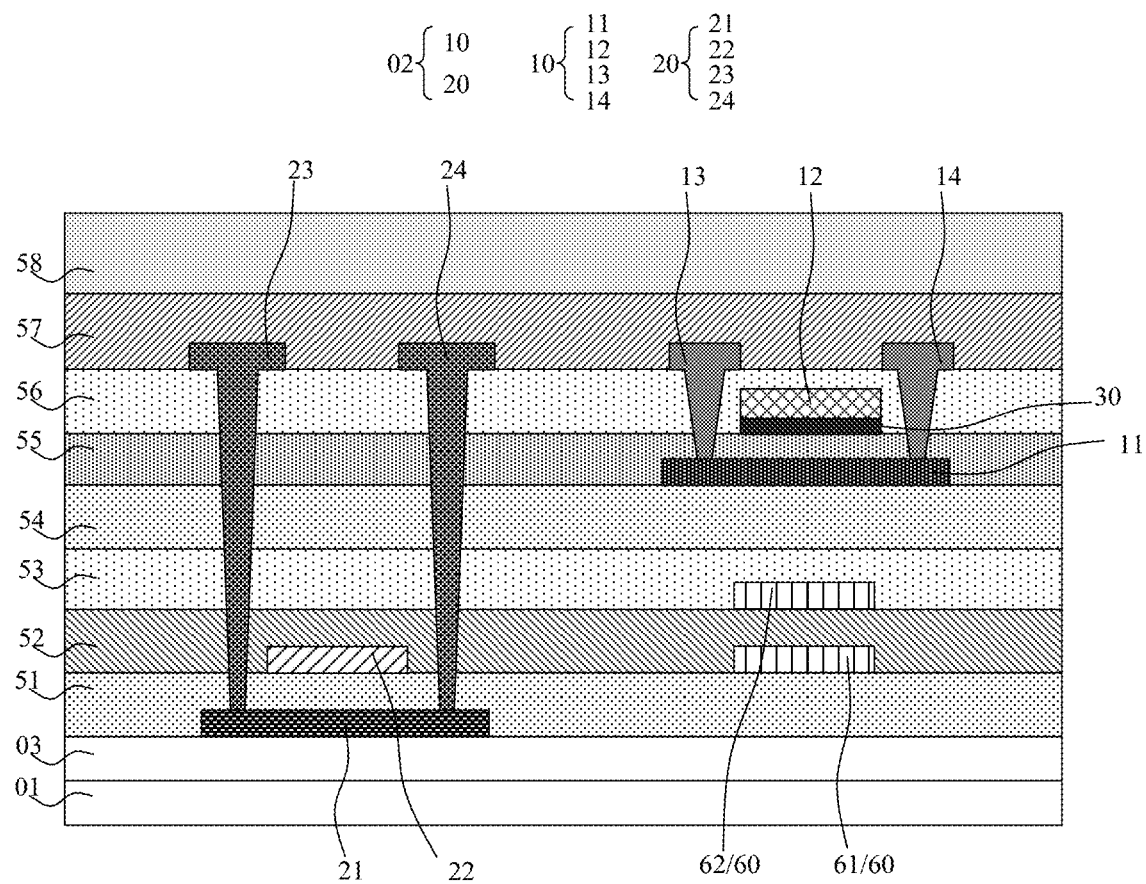
FIG. 2 illustrates another exemplary display panel consistent with various disclosed embodiments of the present disclosure.
Figure 3:
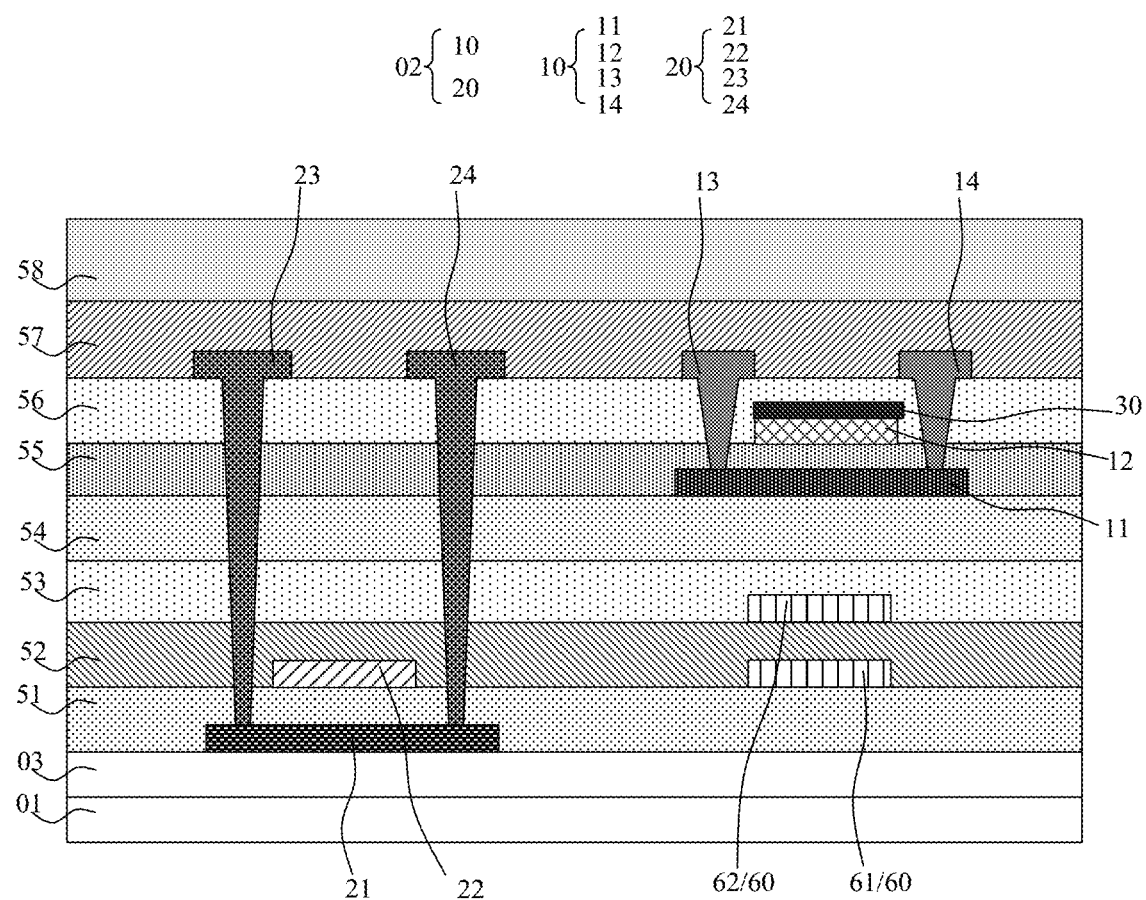
FIG. 3 illustrates another exemplary display panel consistent with various disclosed embodiments of the present disclosure.

One embodiment of the present disclosure provides a display panel illustrated in FIG. 1 to FIG. 3. As shown in FIG. 1 to FIG. 3, in the present embodiment, the display panel 100 may include a substrate 01, a driving circuit 02, and a first light blocking layer 30.

The driving circuit 02 may include an oxide transistor 10 and a silicon transistor 20 arranged on one side of the substrate 01. Exemplarily, the driving circuit 02 may be a pixel circuit or a gate driving circuit. The driving circuit 02 may include a plurality of transistors. At least one of the plurality of transistors may be an oxide transistor 10, and at least one of the plurality of transistors may be a silicon transistor 20. Exemplarily, the oxide transistor has a relatively small leakage current, and can be used as a switching transistor in the driving circuit to reduce power consumption. The silicon transistor 20 has relatively high mobility and can be used as a driving transistor in the driving circuit.

The oxide transistor 10 may be a metal oxide thin film transistor, for example, an Indium Gallium Zinc Oxide (IGZO) thin film transistor. The silicon transistor 20 may be a poly-silicon thin film transistor, for example, a Low-Temperature Poly-Silicon (LTPS) thin film transistor.

The oxide transistor 10 may include a first active layer 11. An orthographic projection of the first light blocking layer 30 on the substrate 01 may at least overlap an orthographic projection of the first active layer 11 on the substrate 01. Compared to the silicon transistor 20, the oxide transistor 10 may be more affected by light. In the embodiment of the present disclosure, the orthographic projection of the first light blocking layer 30 on the substrate 01 may at least overlap the orthographic projection of the first active layer 11 on the substrate 01, such that the first light blocking layer 30 can at least shield the first active layer 11 from light to prevent light from irradiating the first active layer 11. Correspondingly, the leakage current may be prevented from occurring in the first active layer 11. That is, according to the present embodiment of the present disclosure, the stability of the oxide transistor 10 and the display quality of the display panel 100 can be improved.

In some optional embodiments, the first light blocking layer 30 may be an organic film layer capable of blocking light.

The display panel usually includes a plurality of film layers arranged in a stack form. Some of the film layers of the display panel, such as a capacitor insulating layers, an interlayer dielectric layer (ILD), a thin-film encapsulation layer (TFE), are hydrogen-rich film layers. That is, these film layers are rich in hydrogen. The hydrogen in these layers will diffuse into the active layers of the transistors. For example, if hydrogen diffuses into the channel region of the active layer including a metal oxide of a transistor, it will cause a short channel effect in the channel region, which will affect the stability of the transistor.

In some optional embodiments, the first light blocking layer 30 may be made of a material including a non-metallic material. The non-metallic material may include at least one of graphite, carbon nanotube, polypyrene, polyaniline, or a combination thereof. The above-mentioned non-metallic materials are all black materials. Therefore, the use of the above-mentioned materials for the first light blocking layer 30 may not only block light, but also prevent hydrogen from diffusing to the first active layer 11. In some embodiments, the first light blocking layer 30 may be made of a material including single crystalline silicon or a-Si.

Figure 4:
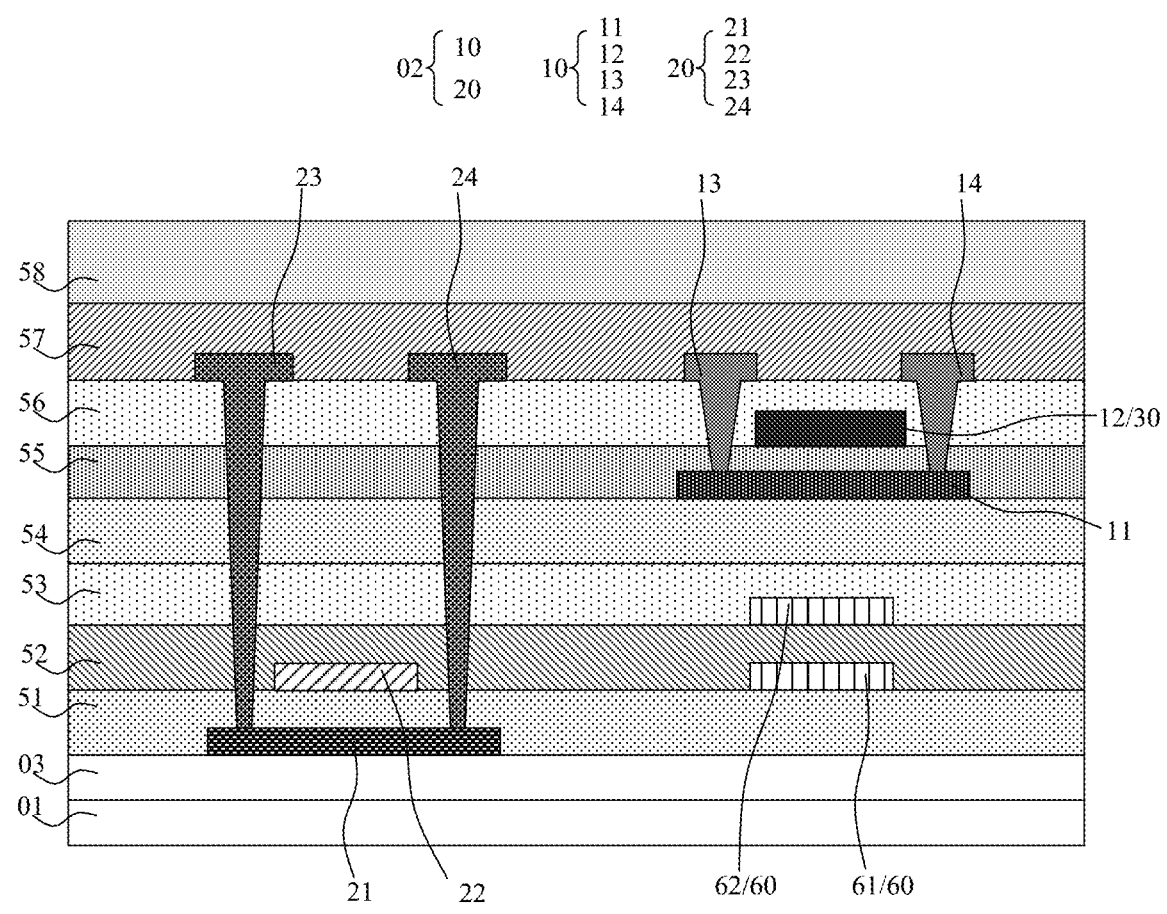
FIG. 4 illustrates another exemplary display panel consistent with various disclosed embodiments of the present disclosure.

In other optional embodiments, the first light blocking layer 30 may be made of a material including a metal material that can block light. The metal material may include at least one of titanium (Ti), aluminum (Al), molybdenum (Mo), or a combination thereof. As shown in FIG. 4, the oxide transistor 10 may include a gate 12. When the first light blocking layer 30 is made of the above-mentioned metal material, the first light blocking layer 30 may not only block light and hydrogen, but may also be multiplexed as the gate 12 of the oxide transistor 10, to simplify the film structure.

In some optional embodiments, the substrate 01 may be a flexible substrate. For example, the substrate 01 may be made of a material including polyimide (PI). In some other embodiments, the substrate 01 may also be a rigid substrate. For example, the substrate 01 may be a glass substrate.

As shown in FIG. 1 to FIG. 3, the first light blocking layer 30 may be located at a side of the first active layer 11 away from the substrate 01. Specifically, the oxide transistor 10 may include the first active layer 11, a first gate 12, a first source 13, and a first drain 14. The silicon transistor 20 may include a second active layer 21, a second gate 22, a second source 23, and a second drain 24. The driving circuit 02 may further include a capacitor 60. The display panel 100 may further include a buffer layer 03, a first gate insulating layer 51, a capacitor insulating layer 52, a first interlayer dielectric layer 53, a second gate insulating layer 54, a third gate insulating layer 55, a second interlayer dielectric layer 56, a protective layer 57 and a planarization layer 58.

The film layer structure of the display panel 100 may include the following structures as shown in FIG. 1 to FIG. 3.

The buffer layer 03 may be located between the substrate 01 and the second active layer 21. The buffer layer 03 may be made of a material including silicon nitride, silicon oxide, or a combination thereof. By providing the buffer layer 03, it may be possible to better prevent water vapor, oxygen, etc. from entering the second active layer 21, and prevent the second active layer 21 from being damaged.

The first gate insulating layer 51 may be located between the second active layer 21 and the second gate 22, and the first gate insulating layer 51 may cover the second active layer 21. The capacitor insulating layer 52 may be located at a side of the second gate 22 away from the substrate 01, and may cover the second gate 22. The first interlayer dielectric layer 53 may be located at a side of the capacitor insulating layer 52 away from the substrate 01. The second gate insulating layer 54 may be located at a side of the first interlayer dielectric layer 53 away from the substrate 01, and the first active layer 11 may be located at a side of the second gate insulating layer 54 away from the substrate 01. The third gate insulating layer 55 may be located between the first active layer 11 and the first gate 12, and the third gate insulating layer 55 may cover the first active layer 11. The second interlayer dielectric layer 56 may be located at a side of the first gate 12 away from the substrate 01, and may cover the first gate 12. The protective layer 57 may be located at a side of the second interlayer dielectric layer 56 away from the substrate 01. The planarization layer 58 may be located at a side of the protection layer 57 away from the substrate 01. The first source 13, the first drain 14, the second source 23, and the second drain 24 may all be located between the second interlayer dielectric layer 56 and the protective layer 57. The first source 13, the first drain 14 may be respectively connected to the source region and the drain region of the first active layer 11 via through holes. The second source 23 and the second drain 24 may be respectively connected to the source region and drain region of the second active layer 21 via through holes.

As shown in FIG. 1, the first light blocking layer 30 may be located between the protective layer 57 and the planarization layer 58. As shown in FIG. 2, the first light blocking layer 30 may be located at a side of the first gate 12 facing the substrate 01. As shown in FIG. 3, the first light blocking layer 30 may be located at the side of the first gate 12 facing the substrate 01. Of course, in some other embodiments, the first light blocking layer 30 may also be located at a side of the first active layer 11 facing the substrate. In some other embodiments, the first light blocking layer 30 may be provided at a side of the first active layer 11 away from the substrate 01 and a side of the first active layer 11 facing the substrate 01. This will be introduced later in the present disclosure. The present disclosure does not limit the specific film position of the first light blocking layer 30 in the display panel 100, as long as the orthographic projection of the first light blocking layer 30 on the substrate 01 at least overlaps the orthographic projection of the first active layer 11 on the substrate 01.

Figure 5:
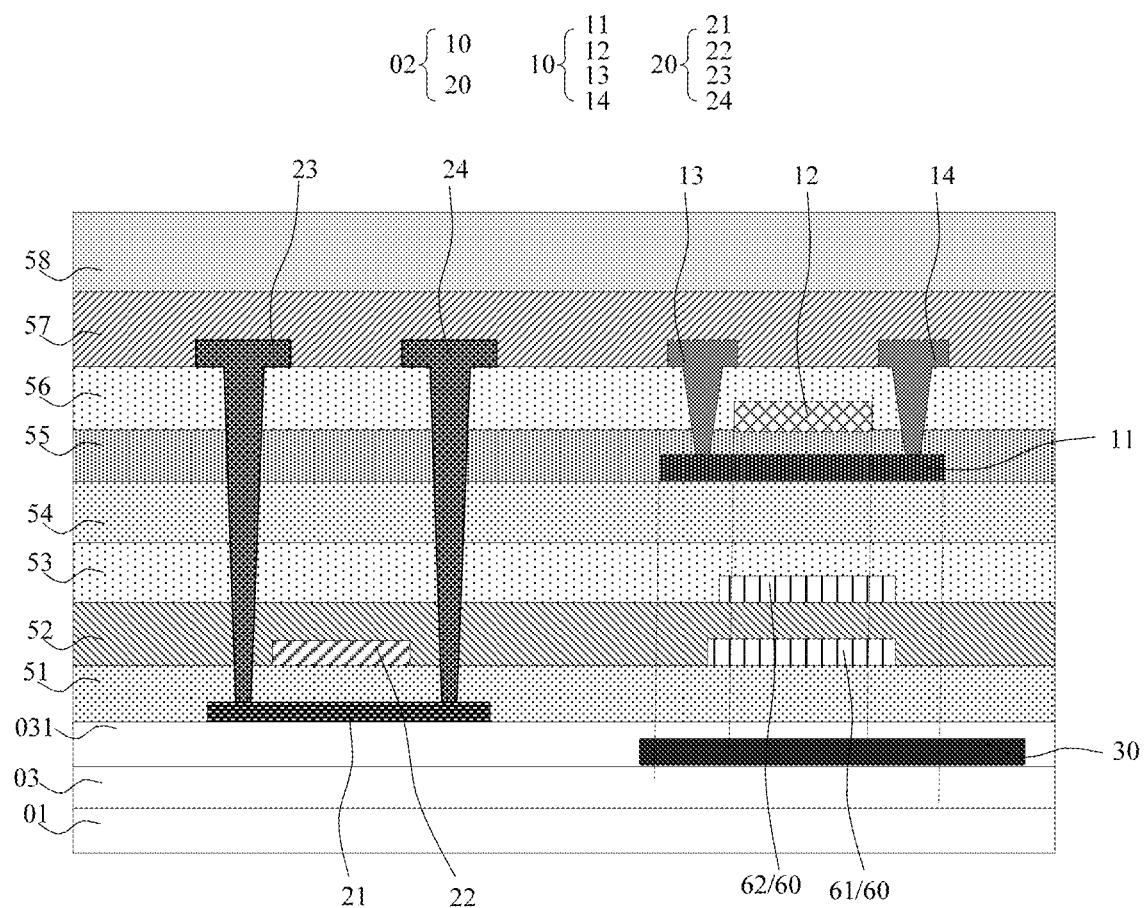
FIG. 5 illustrates another exemplary display panel consistent with various disclosed embodiments of the present disclosure.

As shown in FIG. 5, the first light blocking layer 30 may be located at a side of the first gate 12 facing the substrate 01, and the orthographic projection of the first light blocking layer 30 on the substrate 01 may overlap the orthographic projection of the first active layer 11 on the substrate 01. Correspondingly, the first light blocking layer 30 may be located between the substrate 01 and the first active layer 11, which can reduce the incidence of ambient light from the side of the substrate 01 to the display panel and prevent the light from affecting the first active layer 11. A leakage current phenomenon may be prevented from occurring. Further, the stability of the oxide transistor 10 may be improved to improve the display quality of the display panel 100. Optionally, as shown in FIG. 5, the orthographic projection of the first light blocking layer 30 on the substrate 01 may cover the orthographic projection of the first gate 12 on the substrate 01, and the orthographic projection of the first light blocking layer 30 on the substrate 01 may cover the orthographic projection of the first active material on the substrate 01. It can be understood that the area of the first light blocking layer 30 may be larger than the area of the first gate 12, and the area of the first light blocking layer 30 may be larger than the area of the first active layer 11. The overlapping area of the first active layer 11 and the first gate 12 in the direction perpendicular to the substrate 01 may form the channel area of the oxide transistor. At the same time, because the area of the first light blocking layer 30 is large, other areas of the first active layer 11 may also be protected from light, such that other areas of the first active layer 11 can be prevented from being affected by light to affect the channel area of the first active layer 11. The stability of the oxide transistor may be improved.

Figure 6:
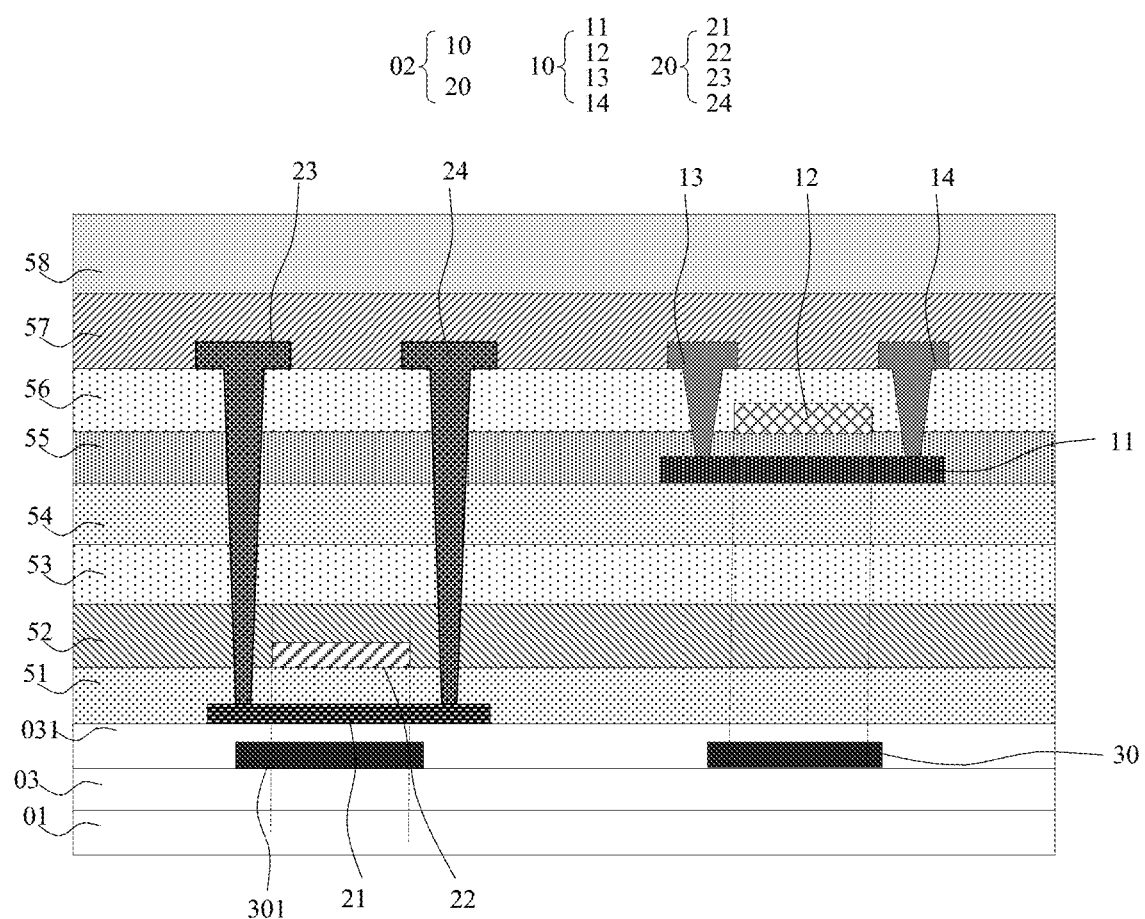
FIG. 6 illustrates a top view of an exemplary display panel consistent with various disclosed embodiments of the present disclosure.

FIG. 6 is a schematic structural diagram of a display panel provided by another embodiment of the present disclosure. Optionally, as shown in FIG. 6, the silicon transistor 20 may be used as the driving transistor of the display panel. To prevent the silicon transistor 20 from being affected by the incident ambient light from the side of the substrate 01, a first light blocking part 301 may be also provided on the side close to the driving transistor 20. An orthographic projection area of the first light blocking part 301 on the substrate 01 may be larger than or equal to the orthographic projection area of the second gate 22 on the substrate 01. That is, a projection of the first light blocking part 301 on a film layer where the second gate 22 is located may cover the second gate 22. Specifically, a dielectric insulating layer 031 and the second active layer 21 may be sequentially arranged on a side of the first light blocking part 301 away from the substrate 01. Optionally, the oxide transistor 10 may be provided with the first light blocking layer 30 on the side close to the substrate 01, and the first light blocking layer 30 may be provided in the same layer with the same material as the first light blocking part 301. In this embodiment, the light blocking layer may be used to simultaneously block light for and protect the oxide transistor and the driving transistor, simplifying the process and saving costs.

Figure 7:
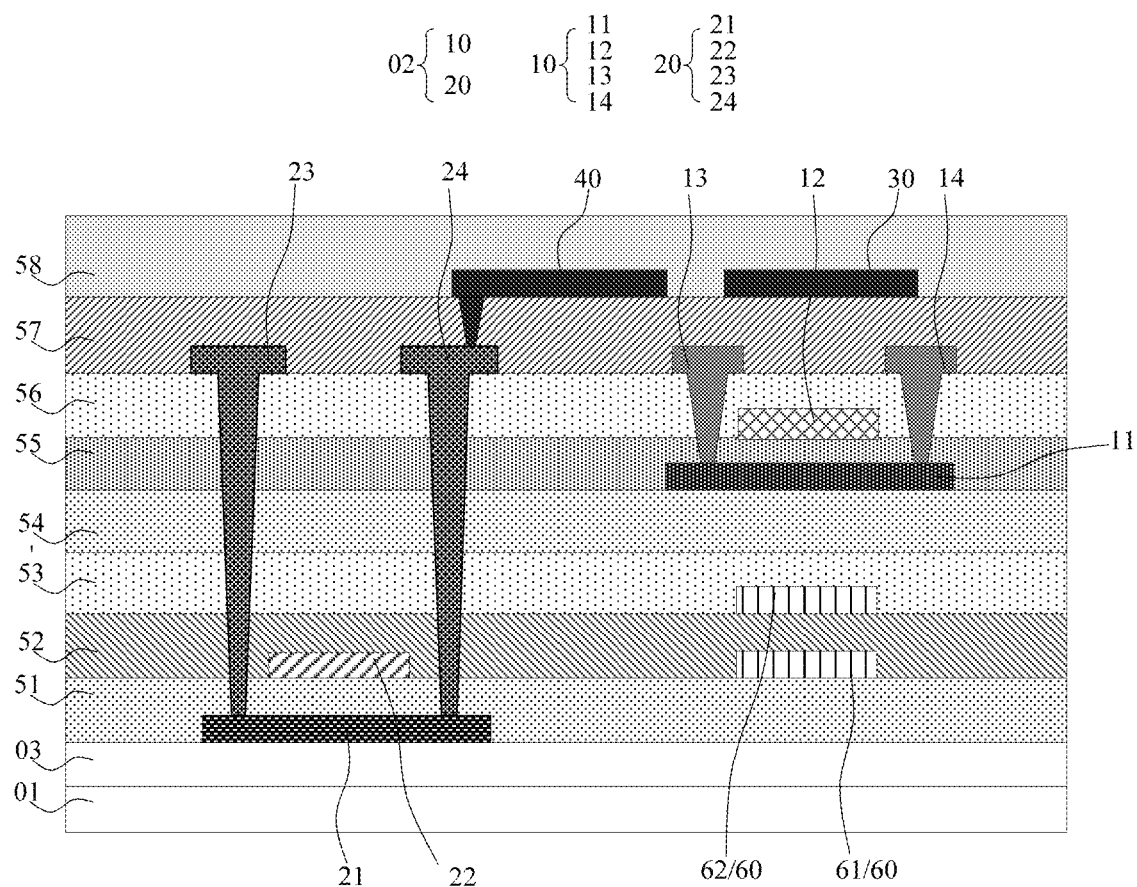
FIG. 7 illustrates another exemplary display panel consistent with various disclosed embodiments of the present disclosure.
Figure 8:
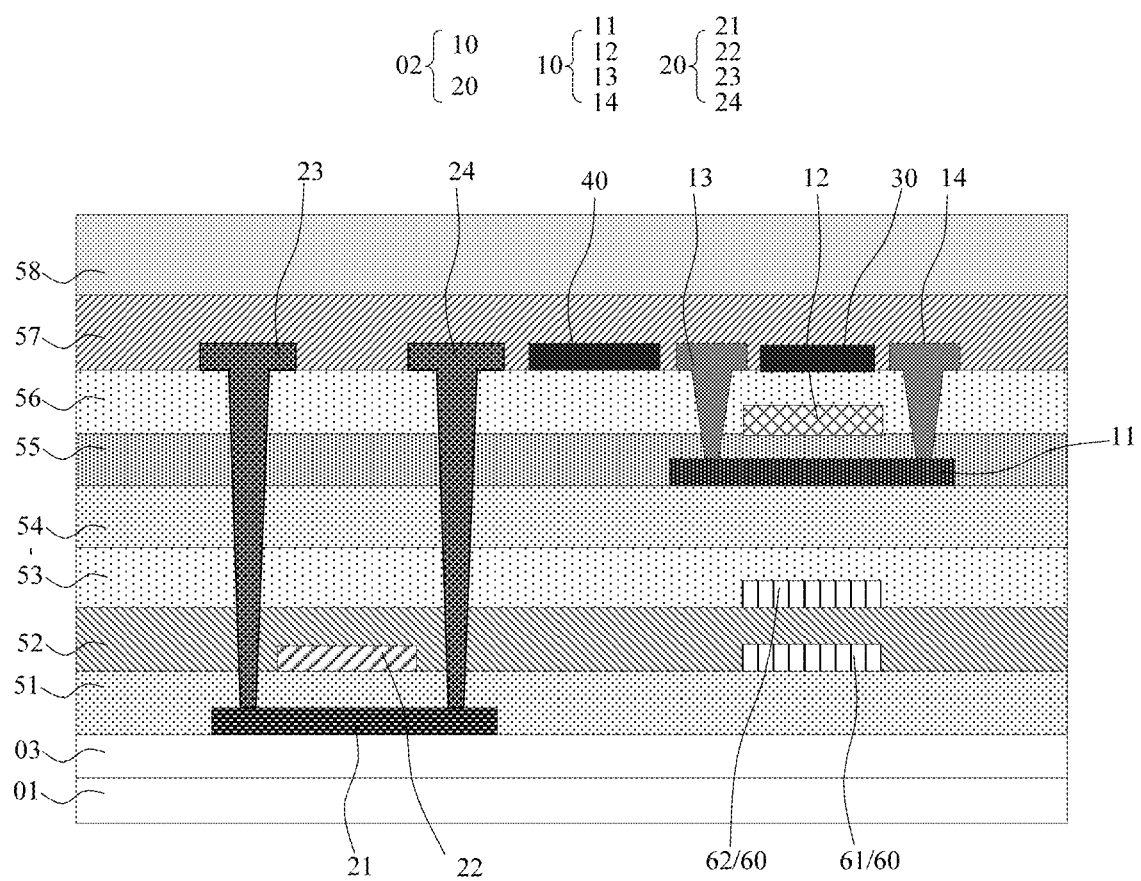
FIG. 8 illustrates another exemplary display panel consistent with various disclosed embodiments of the present disclosure.
Figure 9:
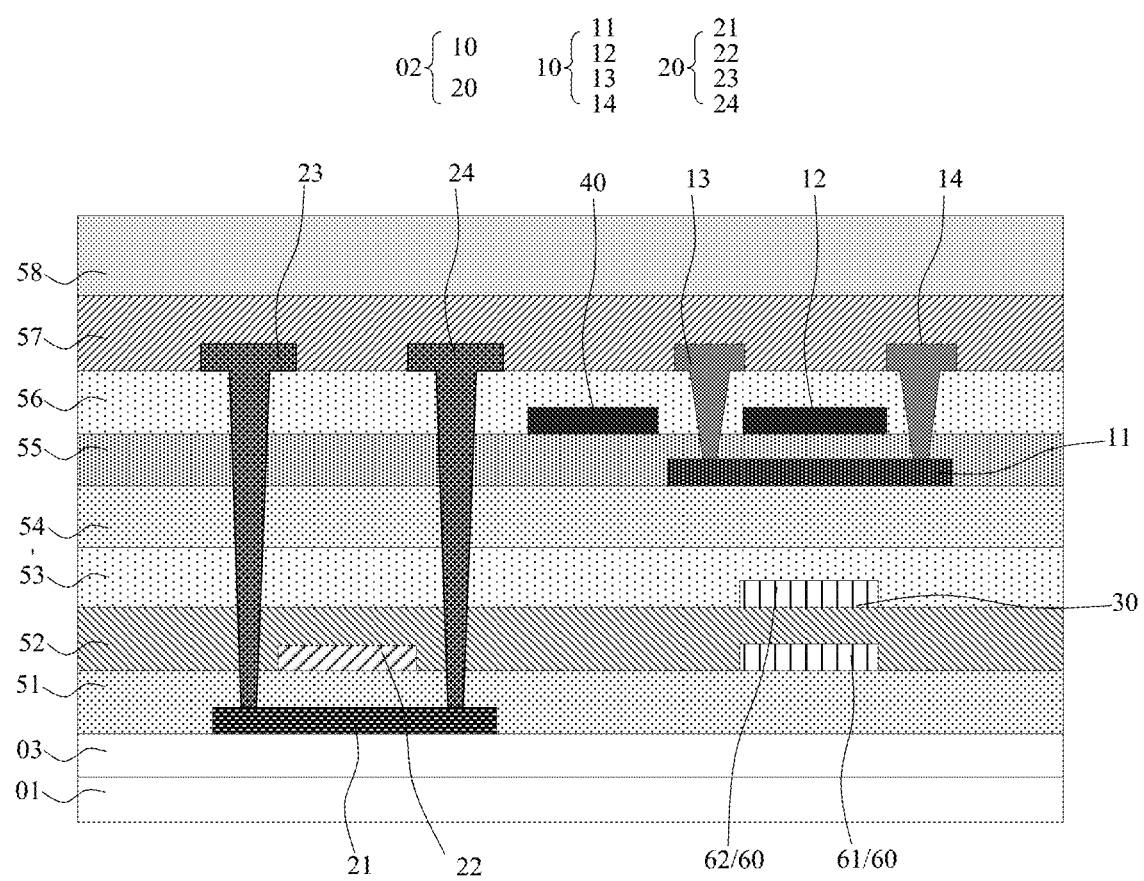
FIG. 9 illustrates another exemplary display panel consistent with various disclosed embodiments of the present disclosure.

In some optional embodiments, as shown in FIG. 7 to FIG. 9, the display panel 100 may further include power signal lines 40. At least a portion of the power signal lines 40 and the first light blocking layer 30 may be located in a same layer. Exemplarily, the power signal lines 40 may be PVDD signal lines. The power signal lines 40 may be made of a conductive material. The first light blocking layer 30 may also be made of a conductive material. By providing the power signal lines 40 and the first light blocking layer 30 in the same layer, on the one hand, there may be no need to separately provide the file layer of the first light blocking layer, which can simplify the manufacturing process of the display panel; on the other hand, the first light blocking layer 30 may be made of conductive material with high reflectivity. The first light blocking layer 30 may have higher light blocking performance to the oxide transistor 10, improving the stability of the oxide transistor.

As shown in FIG. 7, the power signal lines 40 and the first light blocking layer 30 may be located at a side of the silicon transistor 20 and the oxide transistor 30 away from the substrate 01. As shown in FIG. 8, the power signal lines 40 may be arranged in the same layer as the first light blocking layer 30. The power signal lines 40 may be arranged in the same layer as the first source 13 and the first drain 14, or the power signal lines 40 may be arranged in the same layer as the second source 23 and the second drain. 24. In the present embodiment, the first light blocking layer 30 and the power signal lines 40 can be set in the same layer as a certain film layer in the driving circuit without changing each film layer in the driving circuit, which can reduce the number of stacked film layers of the display panel. The process may be simplified, and the costs may be reduced. At the same time, the power signal lines 40 may transmit signals at a fixed potential. By disposing the power signal lines 40 between the silicon transistor 20 and the oxide transistor 10, the mutual interference between the signal transmission of the silicon transistor 20 and the signal transmission of the oxide transistor 10 may be reduced, reducing the coupling capacitance between signal lines and improving the display performance of the display panel.

Figure 10:
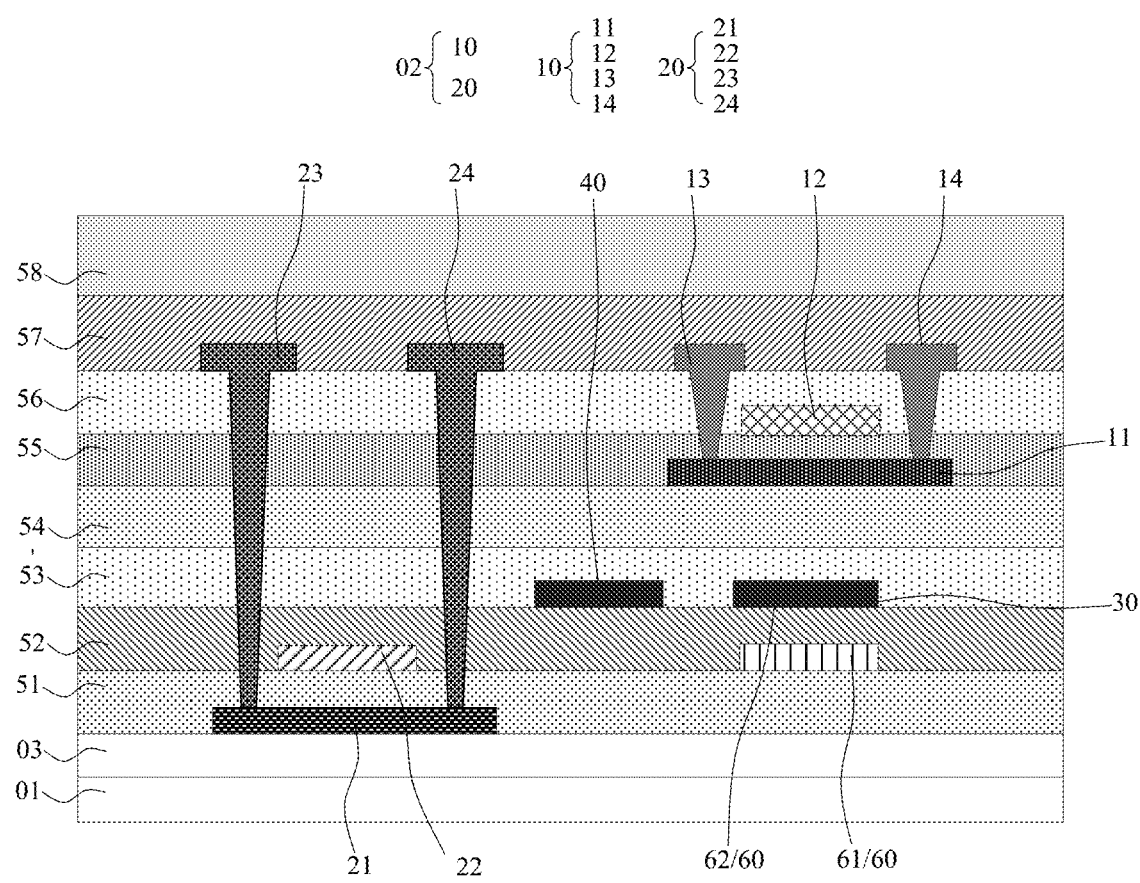
FIG. 10 illustrates another exemplary display panel consistent with various disclosed embodiments of the present disclosure.

As shown in FIG. 9 and FIG. 10, the power signal lines 40 and the first light blocking layer 30 may be arranged in the same layer, and the first light blocking layer 30 may be multiplexed as the first gate 12 of the oxide transistor 10 or the second gate 62 of the oxide transistor 10. Optionally, the second gate 62 may be multiplexed as an electrode plate 62 of the capacitor 60. The power signal lines 40 may transmit signals at a fixed potential. The mutual interference between the signal transmission in signal lines of the display panel may be reduced, and the film layer structure of the display panel may be simplified to reduce the costs.

Figure 11:
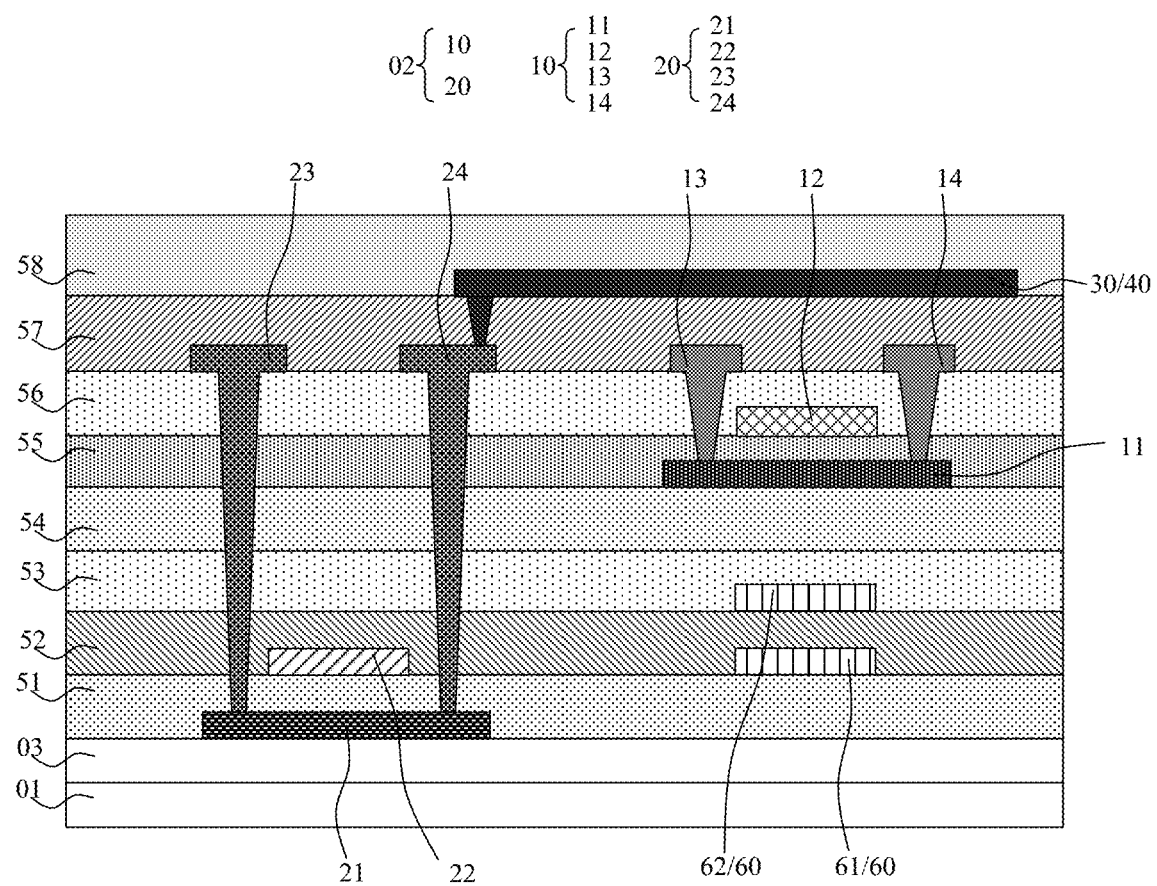
FIG. 11 illustrates another exemplary display panel consistent with various disclosed embodiments of the present disclosure.

In some embodiments, as shown in FIG. 11, at least a portion of the first light blocking layer 30 may be made of a conductive material that can block light. Correspondingly, the first blocking layer 30 can block light, and can be multiplexed as one power signal line 40 of the power signal lines 40. Specifically, the first light blocking layer 30 may be located between the protective layer 57 and the planarization layer 58. The first light blocking layer 30 may be multiplexed as the power signal line 40, which can be electrically connected to corresponding transistors in the driving circuit 02 via through holes. FIG. 11 exemplarily shows that the first light blocking layer 30 is connected to the second drain 24 of the silicon transistor 20 via the through holes. By multiplexing the first light blocking layer 30 as the power signal line 40, the film structure of the display panel 100 can be simplified and the cost can be reduced. Further, a transmission section area of the power signal line 40 may be increased by multiplexing the first light blocking layer 30 as the power signal line 40, which may be beneficial to the transmission of the fixed potential. The voltage drop of signal transmission may be reduced.

Figure 12:
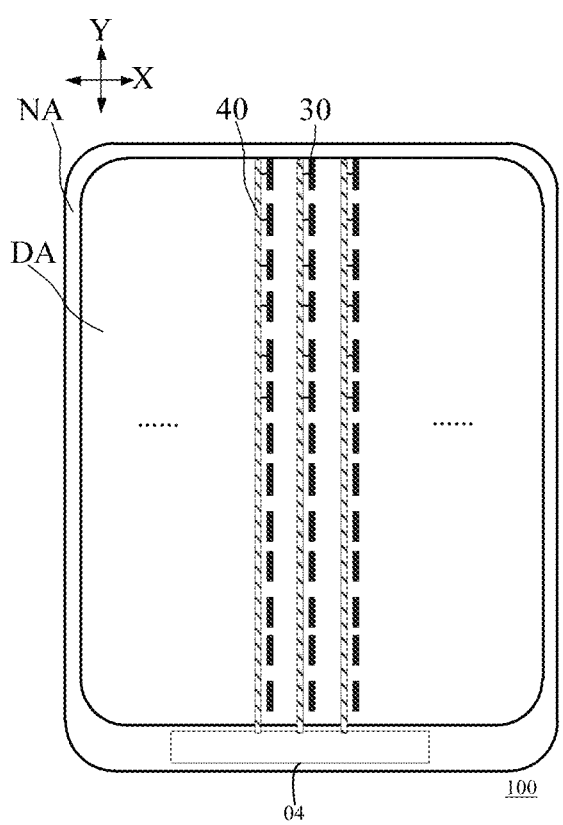
FIG. 12 illustrates a top view of an exemplary display panel consistent with various disclosed embodiments of the present disclosure.

FIG. 12 shows a schematic top view of a display panel provided by an embodiment of the present disclosure. In some optional embodiments, as shown in FIG. 12, the display panel 100 may further include a driving chip 04. A portion of the power signal lines 40 far away from the driving chip 04 may be connected to the first light blocking layer 30, and another portion of the power signal lines 40 close to the driving chip 04 may not be connected to the first light blocking layer 30. The driving chip 04 may be located in a non-display area NA of the display panel 100. Each of the power signal lines 40 may be located in the display area DA of the display panel 100, extend along a second direction Y and be spaced apart in a first direction X. The first direction X may be a row direction of the display panel 100 and the second direction Y may be a column direction of the display panel 100. One end of each of the power signal line 40 can be electrically connected to the drive chip 04, and another end may be electrically connected to the driving circuit 02. In the second direction Y and away from the drive chip 04, the voltage drops on each of power signal line 40 (IR drop) may gradually increase. By connecting the portion of the power signal lines 40 far away from the driver chip 04 to the first light blocking layer 30, it may be equivalent to reducing the resistance of the portion of the power signal lines 40 far away from the driver chip 04. Correspondingly, the voltage drop on the portion of the power signal lines 40 far away from the driver chip 04 and the voltage drop on the portion of the power signal lines 40 close to the driver chip 04 can be balanced, to reduce the voltage drop difference between the two. Correspondingly, display differences at different areas of the display panel due to the different voltage drops of the power signal lines 40 may be reduced.

Figure 13:
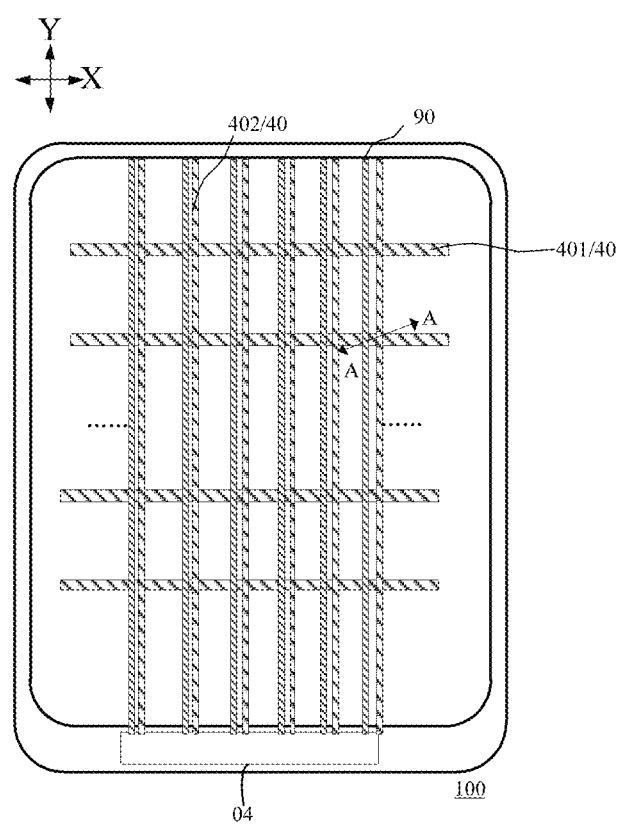
FIG. 13 illustrates a top view of another exemplary display panel consistent with various disclosed embodiments of the present disclosure.
Figure 14:
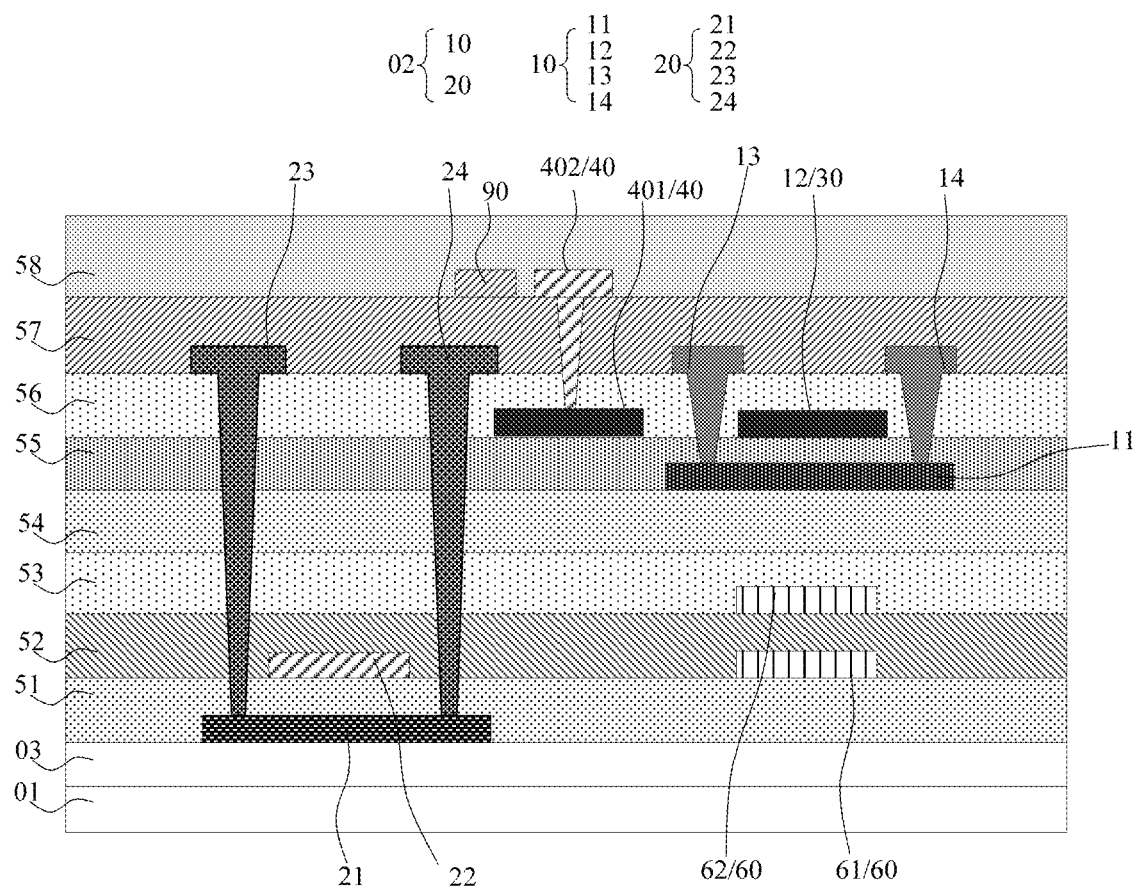
FIG. 14 illustrates a cross-sectional view along A-A in FIG. 13.

In some embodiments shown in FIG. 13 and FIG. 14, the power signal lines 40 may include first sub power signal lines 401 extending in a first direction X and arranged in a second direction Y, and second sub power signal lines 402 extending in the second direction Y and arranged in the first direction X. The first sub power signal lines 401 and the second sub-power signal lines 402 may transmit the same signal. The display panel 100 may further include data signal lines. The data signal lines may extend in the second direction Y and may be arranged in the first direction X. The first sub power signal lines 401 and the first light blocking layer 30 may be disposed in the same layer, and the first light blocking layer 30 may be multiplexed as the first gate 12. It can be understood that the first light blocking layer 30 may be multiplexed as the first gate 12 of the oxide transistor 10, and the first sub power signal lines 401 and the first gate 12 may be disposed in the same layer. In this embodiment, the first sub power signal lines 401 may utilize the space of the film layer where the first light blocking layer 30 is located well. Further, the data signal lines 90 and the second sub power signal lines 402 may have the same extension direction. Disposing the data signal lines 90 and the second sub power signal lines 402 in the same film layer may not affect the transmission of the respective signals. The film layers may be simplified. Further, at least the second sub power signal lines 402 transmitting a fixed potential may be arranged between different data signal lines, which can reduce the signal crosstalk problem on the data signal lines due to the jump of the transmission signal. The display performance of the display panel may be optimized.

Figure 15:
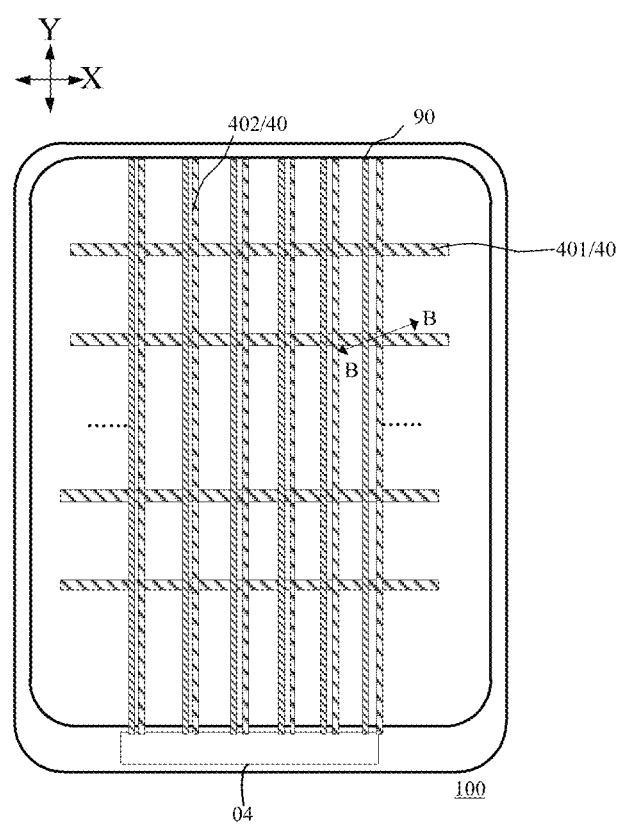
FIG. 15 illustrates a top view of another exemplary display panel consistent with various disclosed embodiments of the present disclosure.
Figure 16:
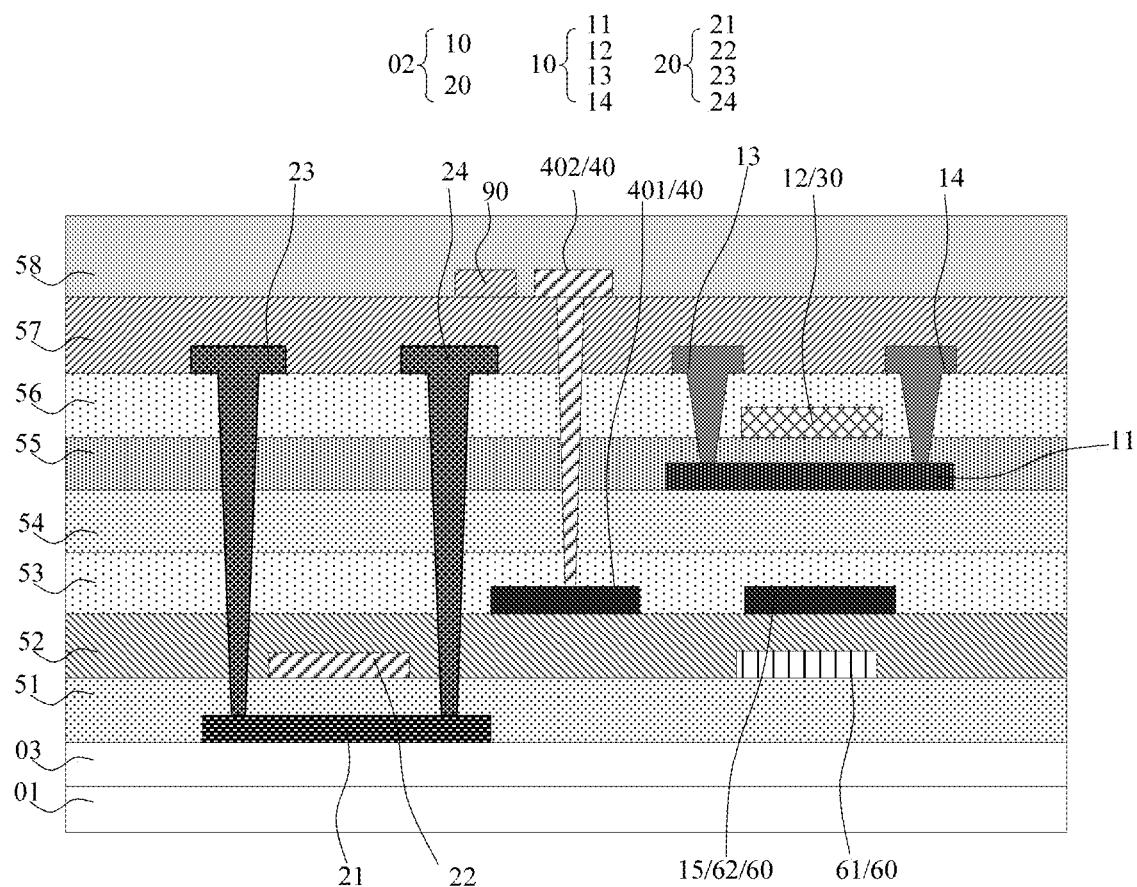
FIG. 16 illustrates a cross-sectional view along B-B in FIG. 13.

In some embodiments shown in FIG. 15 and FIG. 16, the power signal lines 40 may include first sub power signal lines 401 extending in a first direction X and arranged in a second direction Y, and second sub power signal lines 402 extending in a second direction Y and arranged in the first direction X. The first sub-power signal lines 401 and the second sub-power signal lines 402 may transmit the same signal. The display panel 100 may further include data signal lines. The data signal lines may extend in the second direction Y and may be arranged in the first direction X. The first sub power signal lines 401 and the first light blocking layer 30 may be disposed in the same layer, and the first light blocking layer 30 may be multiplexed as the first gate 12. It can be understood that the first light blocking layer 30 may be multiplexed as the second gate 15 of the oxide transistor 10, and the first sub power signal lines 401 and the second gate 15 may be disposed in the same layer. In this embodiment, the first sub power signal lines 401 may utilize the space of the film layer where the first light blocking layer 30 is located well. The influence of the ambient light from the side of the substrate 01 on the display panel may be reduced. Further, the data signal lines 90 and the second sub power signal lines 402 may have the same extending direction. Disposing the data signal lines 90 and the second sub power signal lines 402 in the same film layer may not affect the transmission of the respective signals. The film layers may be simplified. Further, at least the second sub power signal lines 402 transmitting a fixed potential may be arranged between different data signal lines, which can reduce the signal crosstalk problem on the data signal lines due to the jump of the transmission signal. The display performance of the display panel may be optimized.

Figure 17:
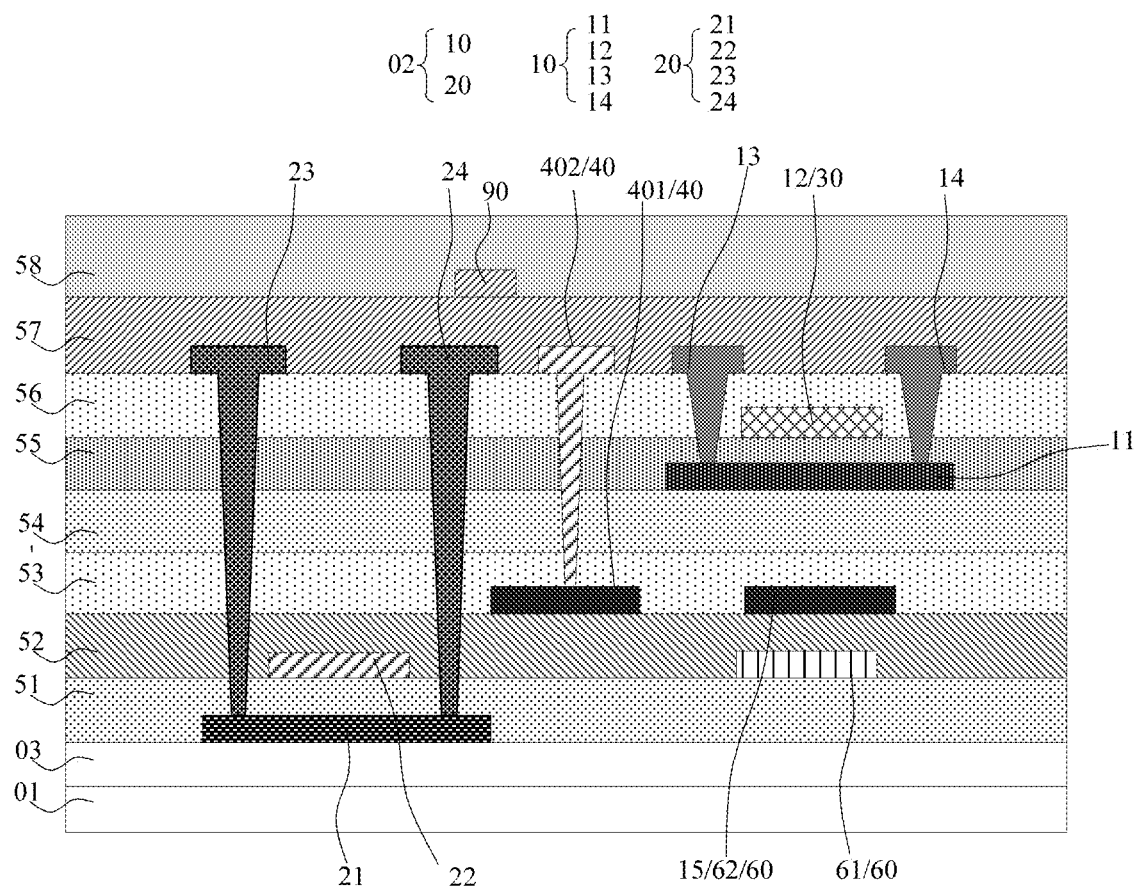
FIG. 17 illustrates another cross-sectional view along B-B in FIG. 13.

In some embodiments, as shown in FIG. 17, the second sub power signal lines 402 may be arranged in the same layer as the second source 23 and the second drain 24 of the silicon transistor 20, or may be arranged in the same layer as the first source 13 and the first drain 14 of the oxide transistor 10. The power signal lines 40 may transmit signals at a fixed potential. By disposing the power signal lines 40 between the silicon transistor 20 and the oxide transistor 10, the signal interference between the signal transmission of the silicon transistor 20 and the signal transmission of the oxide transistor 10 may be reduced. Correspondingly, the coupling capacitance between the signal lines may be reduced and the display performance of the display panel may be improved.

Figure 18:
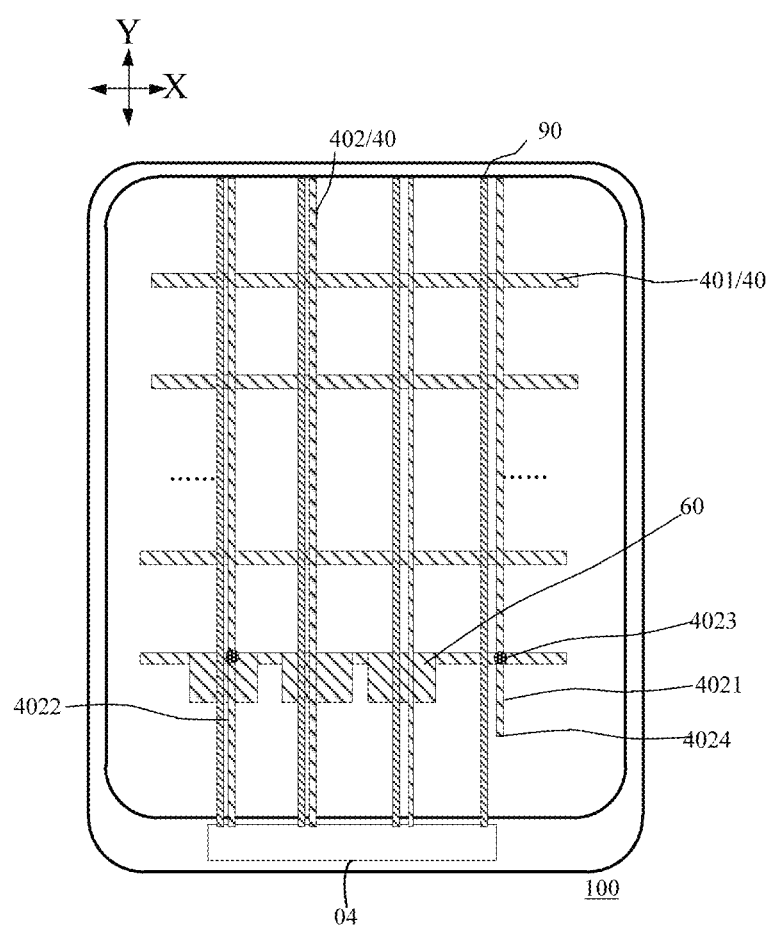
FIG. 18 illustrates a top view of another exemplary display panel consistent with various disclosed embodiments of the present disclosure.

In some optional embodiments, as shown in FIG. 18, the second sub power signal lines 402 may include a first portion 4021 and a second portion 4022. In the first direction X, at least the first portion 4021 may not overlap the second portion 1022. That is, on a straight line along the first direction X, the second portion 4022 may be provided without the first portion 4021. It is understandable that a length of the first portion 4021 may be smaller than a length of the second portion 4022, or the first portion 4021 may have a broken end 4024, and an orthographic projection of the end 4024 may be located in the first portion 4021. The first portion 4021 may be electrically connected to the first sub power signal lines 401 via a through hole 4023. In this embodiment, the second sub power signal lines 402 may include the first portion 4021 and the second portion 4022. The first sub power signal lines 401 may be used to connect the first portion 4021 and the second portion 4022 with different positions and lengths to save wiring space. Optionally, the display panel may include the capacitor 60, and the second gate 15 may be disposed in a layer same as any one electrode plate of the capacitor.

Figure 19:
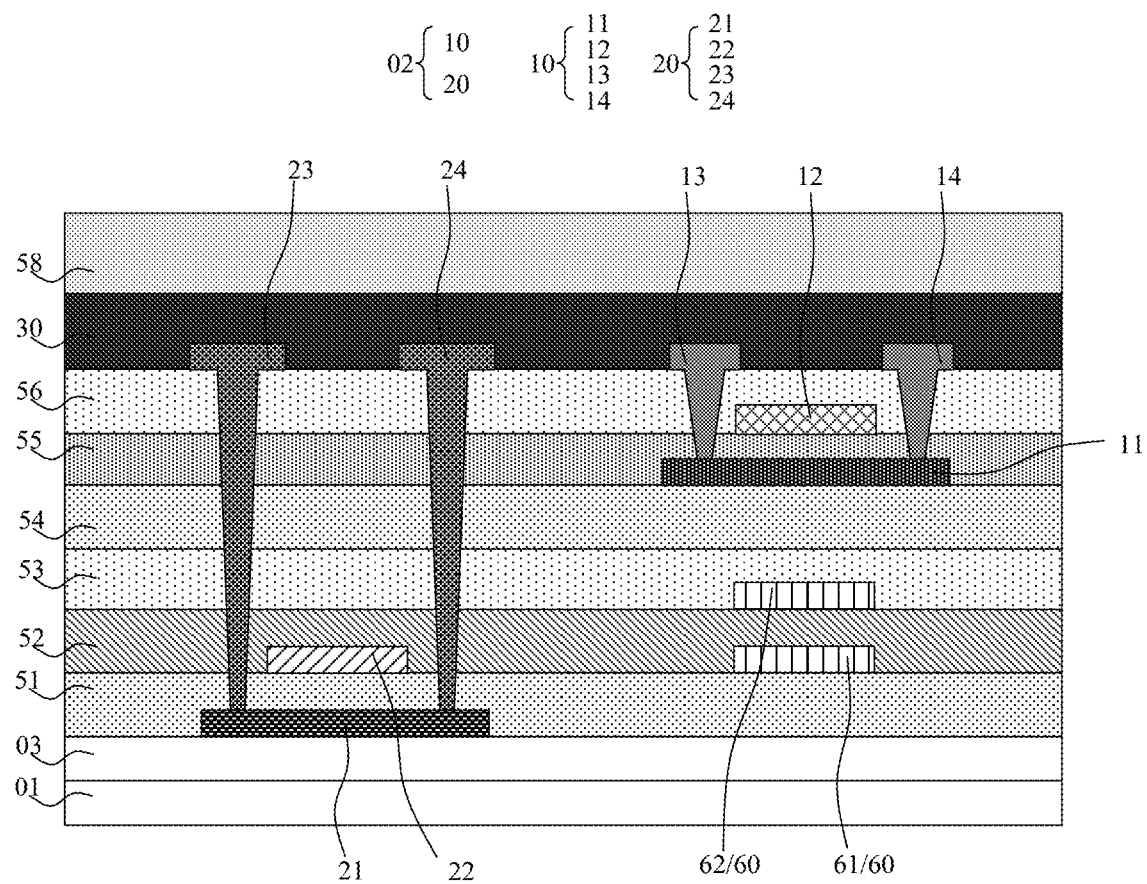
FIG. 19 illustrates another exemplary display panel consistent with various disclosed embodiments of the present disclosure.

In some embodiments, as shown in FIG. 19, the first light blocking layer 30 may cover the first source 13 and the first drain 14 of the oxide transistor 10, and the first light blocking layer 30 may be multiplexed as a protective layer of the first source 13 and the first drain 14 of the oxide transistor 10. In the present embodiment, the first light blocking layer 30 may be provided between the first source 13 and the first drain 14 and may be multiplexed as the protective layer. Correspondingly, there may be no need to additionally provide a protective layer for the first source 13 and the first drain 14, which can simplify the film structure of the display panel and reduce the cost.

Exemplarily, a dielectric constant of the first light blocking layer 30 may be from 1 to 8 $C^2/(N \cdot M^2)$, such that the dielectric constant of the first light blocking layer 30 may be relatively large. Correspondingly, the insulation performance between the source and the drain may be increased, and a short circuit between the source and the drain may be prevented.

Exemplarily, the orthographic projection of the first light blocking layer 30 on the substrate 01 may also overlap an orthographic projection of the second active layer 21 of the silicon transistor 20 on the substrate 01. The first light blocking layer 30 may also cover the second source 23 and the second drain 24 of the silicon transistor 20, and the first light blocking layer 30 may also be multiplexed as a protective layer of the second source 23 and the second drain 24 of the silicon transistor 20.

Figure 20:
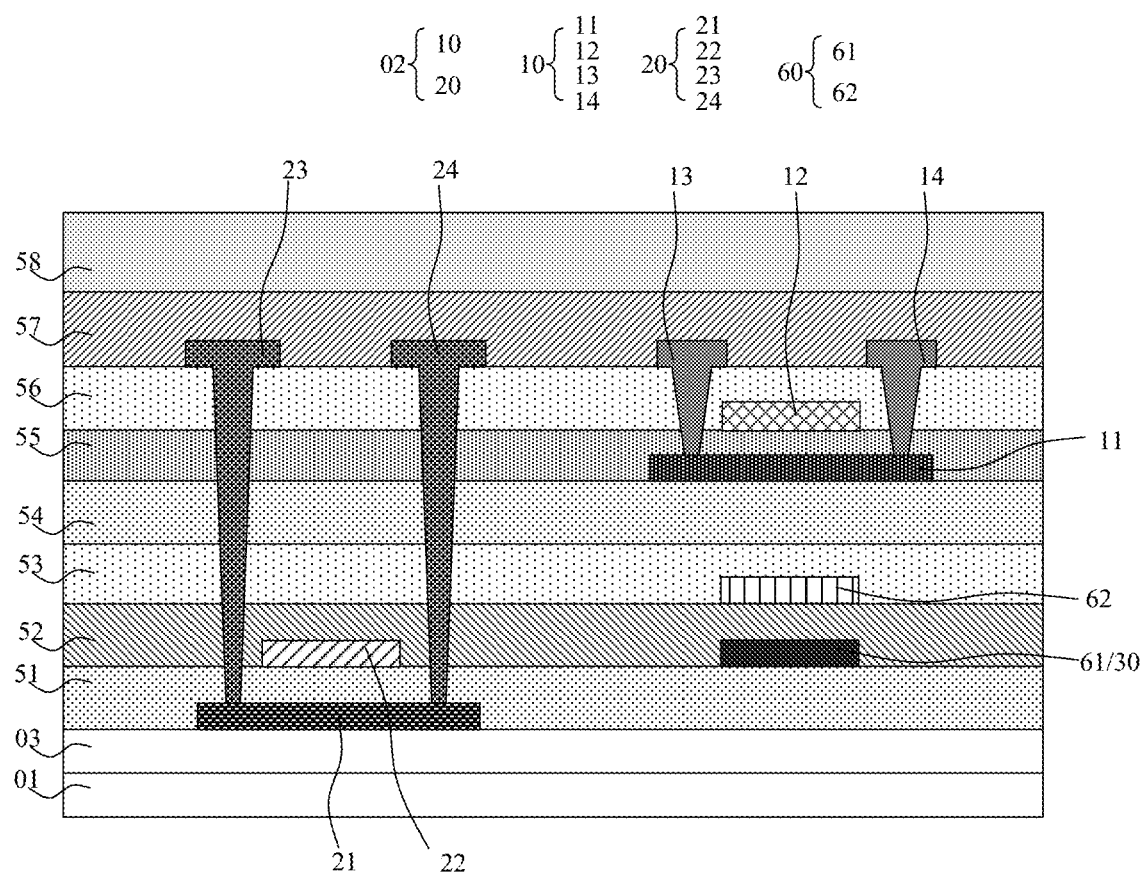
FIG. 20 illustrates another exemplary display panel consistent with various disclosed embodiments of the present disclosure.

In some optional embodiments, as shown in FIG. 20, the capacitor 60 of the display panel 100 may be disposed between the first active layer 11 and the substrate 01, and the first light blocking layer 30 may be located at a side of the first active layer 11 facing the substrate. The first light blocking layer 30 may be multiplexed as an electrode plate of the capacitor 60. It is understandable that when the first light blocking layer 30 is multiplexed as one electrode plate of the capacitor 60, the first light blocking layer 30 should be a conductive layer capable of shielding light.

Specifically, as shown in FIG. 20, the capacitor 60 may include a first electrode plate 61 and a second electrode plate 62. The first electrode plate 61 can be arranged in a layer same as the second gate 22 of the silicon transistor 20, and a capacitor insulating layer 52 may be spaced between the second electrode plate 62 and the first electrode plate 61. The first light blocking layer 30 may be multiplexed as the first plate 61 of the capacitor 60.

In the present embodiment, the first light blocking layer 30 may be multiplexed as one electrode plate of the capacitor 60, which can simplify the film structure of the display panel and reduce the cost.

Figure 21:
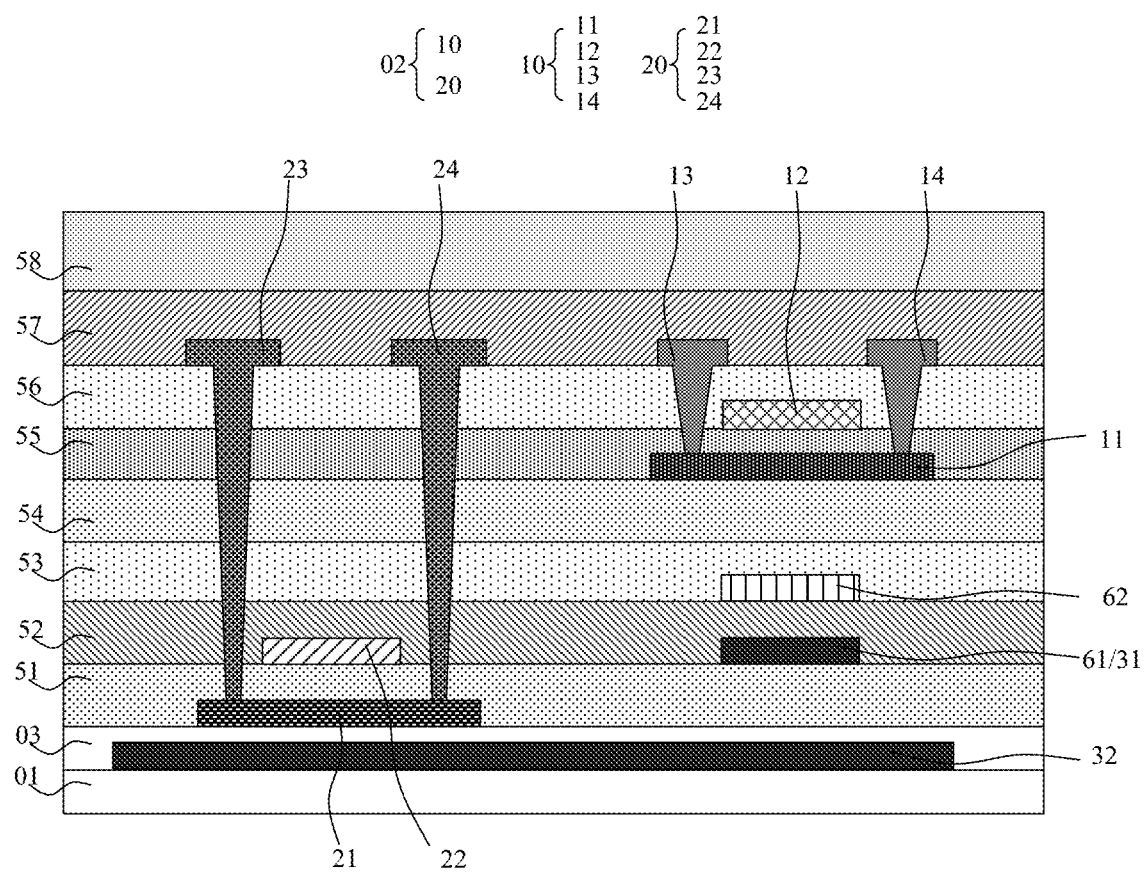
FIG. 21 illustrates another exemplary display panel consistent with various disclosed embodiments of the present disclosure.

The power consumption and leakage current of the oxide transistor 10 are relatively small. Compared with the silicon transistor 10, the oxide transistor 10 may need more light blocking protection. In some optional embodiments, as shown in FIG. 21, two first light blocking layers 30 including a first light blocking sublayer 31 and a second light blocking sublayer 32 may be disposed in stack at one side of the first active layer 11 facing the substrate 01. The first light blocking sub-layer 31 may be located between the first active layer 11 and the second light blocking sub-layer 32, and may be multiplexed as an electrode plate of the capacitor 60. The first light blocking sublayer 31 may be disposed in a layer same as the second gate 22 of the silicon transistor 20. Orthographic projections of the first light blocking sublayer 31 and the second light blocking sublayer 32 on the substrate 01 may both overlap the orthographic projection of the first active layer 11 on the substrate 01. That is, the first light blocking sublayer 31 and the second light blocking sublayer 32 both can achieve a light blocking protection function for the first active layer 11, thereby realizing double protection for the first active layer 11 and enhancing the protection strength of the first active layer 11. Further, the first light blocking sublayer 31 and the second gate 22 of the silicon transistor 20 are arranged in the same layer. In one embodiment, the first light blocking sublayer 31 and the second gate 22 may be made of the same material, such that the first light blocking sublayer 31 and the second gate 22 can be made in one process and can be formed at the same time. The manufacturing process may be simplified, and the cost may be reduced. The second light blocking sublayer 32 may be made of a material including a-Si or single crystalline silicon. The single crystalline silicon may have a large light absorption coefficient and may have strong absorption of ambient light, which can block ambient light from entering the display panel and affecting the area around the second light blocking sublayer 32.

In some alternative embodiments, as shown in FIG. 21, a buffer layer 03 of the display panel may be located between the second active layer 21 of the silicon transistor 20 and the substrate 01, and the second light blocking sublayer 32 may be disposed between the buffer layer 03 and the substrate 01. The orthographic projection of the second light blocking sublayer 32 on the substrate 01 may overlap the orthographic projection of the first active layer 11 and the second active layer 21 on the substrate 01. That is, the second light blocking sublayer 32 can protect the first active layer 11 and the second active layer 21 from light, and can prevent light from irradiating the first active layer 11 and the second active layer 21. Correspondingly, the leakage current may be prevented from occurring in the active layer of each transistor, therefore improving the stability of each transistor and further improving the display quality of the display panel.

Figure 22:
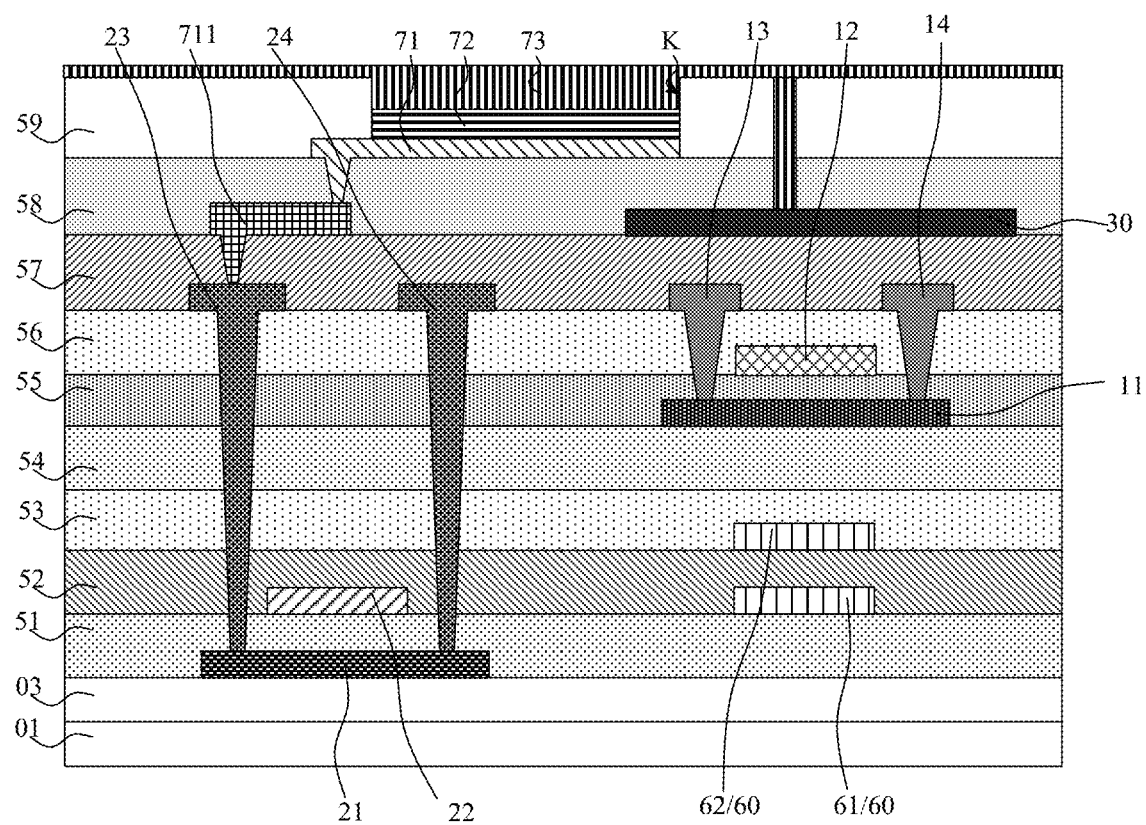
FIG. 22 illustrates another exemplary display panel consistent with various disclosed embodiments of the present disclosure.

Another embodiment of the present disclosure shown in FIG. 22 also provides another display panel. As shown in FIG. 22, the display panel 100 may further include a light-emitting function layer 70. The light-emitting function layer 70 may include a first electrode 71, a light-emitting layer 72, and a second electrode 73 that are stacked. The first electrode 71 may be disposed at a side of the oxide transistor 10 and the silicon transistor 20 away from the substrate, and the light-emitting layer 72 may be disposed at a side of the first electrode 71 away from the substrate 01. The second electrode 73 may be disposed at a side of the light-emitting layer 72 away from the first electrode. 71. One of the first electrode 71 and the second electrode 73 may be an anode, and another may be a cathode. For description purposes only, the embodiment of where the first electrode 71 is an anode and the second electrode 73 is a cathode is used as an example to illustrate the present disclosure, and does not limit the scope of the present disclosure.

The display panel 100 may further include a pixel definition layer 59, and the pixel definition layer 59 may be disposed at a side of a planarization layer 58 away from the substrate 01. The pixel defining layer 59 may include an opening area K, and the opening area K may expose the first electrode 71. The light-emitting layer 72 may be disposed in the opening area K of the pixel defining layer 59.

The first light blocking layer 30 may be located between the first electrode 71 and the oxide transistor 10, and may be connected to the second electrode 72 through a through hole. By connecting the first light blocking layer 30 and the second electrode 72, the thickness of the second electrode 72 in the direction perpendicular to the light-emitting surface of the display panel may be increased, and the resistance of the second electrode 72 may be reduced. That is, the voltage drop of the second electrode 72 may be reduced. It should be understood that when the first light blocking layer 30 is connected to the second electrode 72, the first light blocking layer 30 may be a light blocking conductive structure.

Exemplarily, the first source 13 and the first drain 14 of the oxide transistor 10, and the second source 23 and the second drain 24 of the silicon transistor 20 may be located between the second interlayer dielectric layer 56 and the protective layer 57. A planarization layer 58 may be provided between the first electrode 71 and the protective layer 57, and the first light blocking layer 30 may be provided between the protective layer 57 and the planarization layer 58. The display panel 100 may further include an interposer layer 711 provided in the same layer as the first light blocking layer 30, such that the first electrode 71 is electrically connected to a corresponding transistor in the driving circuit 02 through the interposer layer 711. As shown in FIG. 10, the first electrode 71 may be connected through the interposer layer 711, and the interposer layer 711 may be connected to the second source 23 of the silicon transistor 20 via a through hole. By arranging the interposer layer 711 and the first light blocking layer 30 in the same layer, the same conductive material can be used to form the interposer layer 711 and the first light blocking layer 30. Correspondingly, the interposer layer 711 and the first light blocking layer 30 can be formed at the same time in the same process, therefore simplifying the process. In addition, by providing the interposer layer 711, it may be equivalent to that the first electrode 71 is electrically connected to a corresponding transistor in the driving circuit 02 through two through holes, which can reduce the difficulty of punching.

Figure 23:
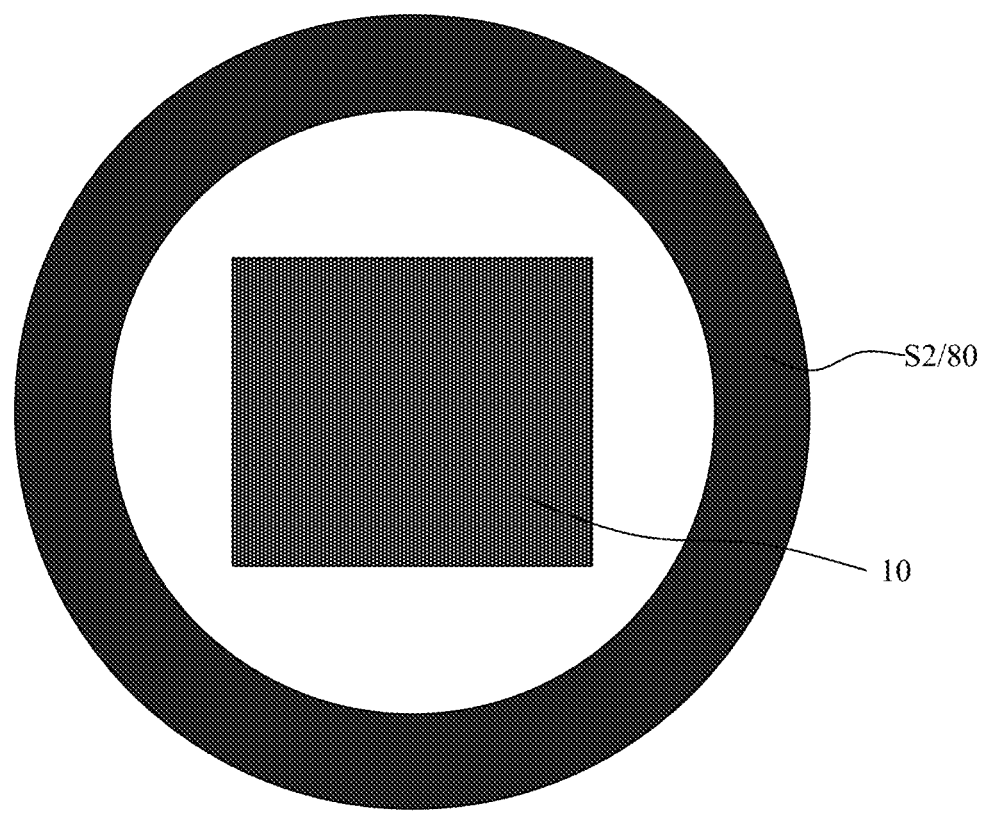
FIG. 23 illustrates a top view of a second light blocking layer and oxide transistor consistent with various disclosed embodiments of the present disclosure.
Figure 24:
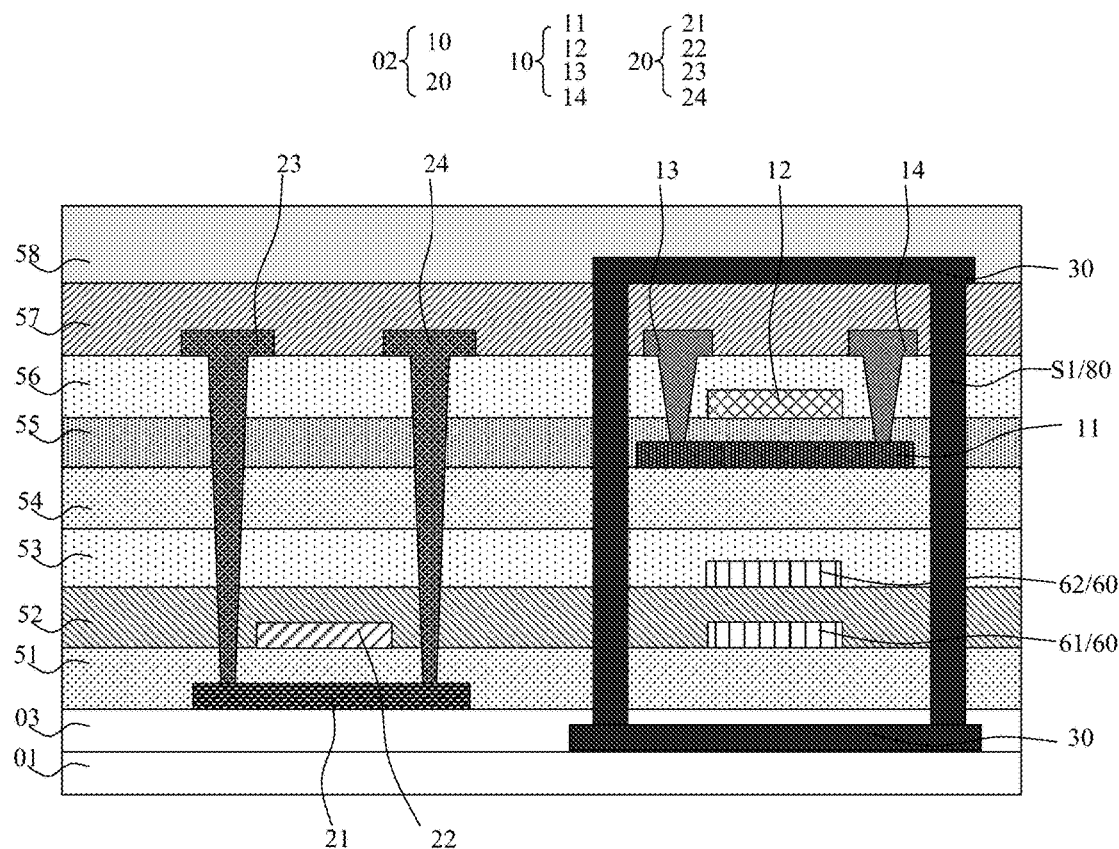
FIG. 24 illustrates another exemplary display panel consistent with various disclosed embodiments of the present disclosure.

In some embodiments, as shown in FIG. 23 and FIG. 24, the display panel 100 may further include a second light blocking layer 80. In the direction perpendicular to the light emitting surface of the display panel 100, the second light blocking layer 80 may have a first cross-section S1, and the first cross-section S1 may intersect the substrate 01. That is, the second light blocking layer 80 may have a certain height in the direction perpendicular to the light-emitting surface of the display panel 100. In a direction parallel to the light-emitting surface of the display panel 100, the second light blocking layer 80 may have a second cross-section S2, and the second cross-section S2 may at least partially surround the oxide transistor 10. That is, the second light blocking layer 80 may at least partially surround the oxide transistor 10. By providing the second light blocking layer 80, more comprehensive light blocking protection for the oxide transistor 10 can be achieved.

Exemplarily, as shown in FIG. 24, in the direction perpendicular to the light-emitting surface of the display panel 100, the length of the first cross-section S1 may be larger than or equal to a distance from the first source 13, the first drain 14, to the first active layer 11 of the oxide transistor 10. Correspondingly, the oxide transistor 10 can be effectively shielded from light.

Exemplarily, the first source 13 and the first drain 14 of the oxide transistor 10 may be both disposed between the second interlayer dielectric layer 56 and the protective layer 57, and the first active layer 11 of the oxide transistor 10 may be located at a side of the second gate insulating layer 54 away from the substrate 01. In the direction perpendicular to the light-emitting surface of the display panel 100, the first cross-section S1 may at least extend from the surface of the first active layer 11 to surfaces of the first source 13 and the first drain 14 away from the substrate 01, along a direction toward the surface of the substrate 01.

In some embodiments, as shown in FIG. 24, the second light blocking layer 80 may be arranged in contact with the first light blocking layer 30. Both the side of the first active layer 11 facing the substrate 01 and the side away from the substrate 01 may be provided with the first light blocking layer 30. For example, the side of the protective layer 57 away from the substrate 01 may be provided with the first light blocking layer 30, and the side of the buffer layer 03 facing the substrate 01 may be also provided with the first light blocking layer 30. In the direction parallel to the light-emitting surface of the display panel 100, the second cross-section S2 of the second light blocking layer 80 may surround the oxide transistor 10. The second light blocking layer 80 and the first light blocking layer 30 may together form an enclosed protection for the oxide transistor 10, further enhancing the protection of the oxide transistor 10.

In some embodiments, the first light blocking layer 30 and the second light blocking layer 80 may both be organic layers.

In some other embodiments, the first light blocking layer 30 and the second light blocking layer 80 may both be conductive structures and connected to a fixed potential. Correspondingly, electrostatic protection of the oxide transistor 10 can be achieved.

Figure 25:
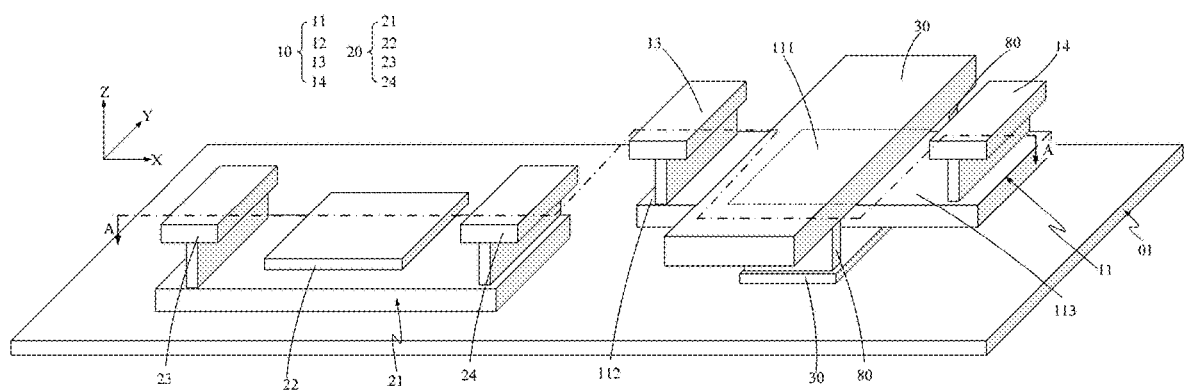
FIG. 25 illustrates a three-dimensional structure of an exemplary display panel consistent with various disclosed embodiments of the present disclosure.
Figure 26:
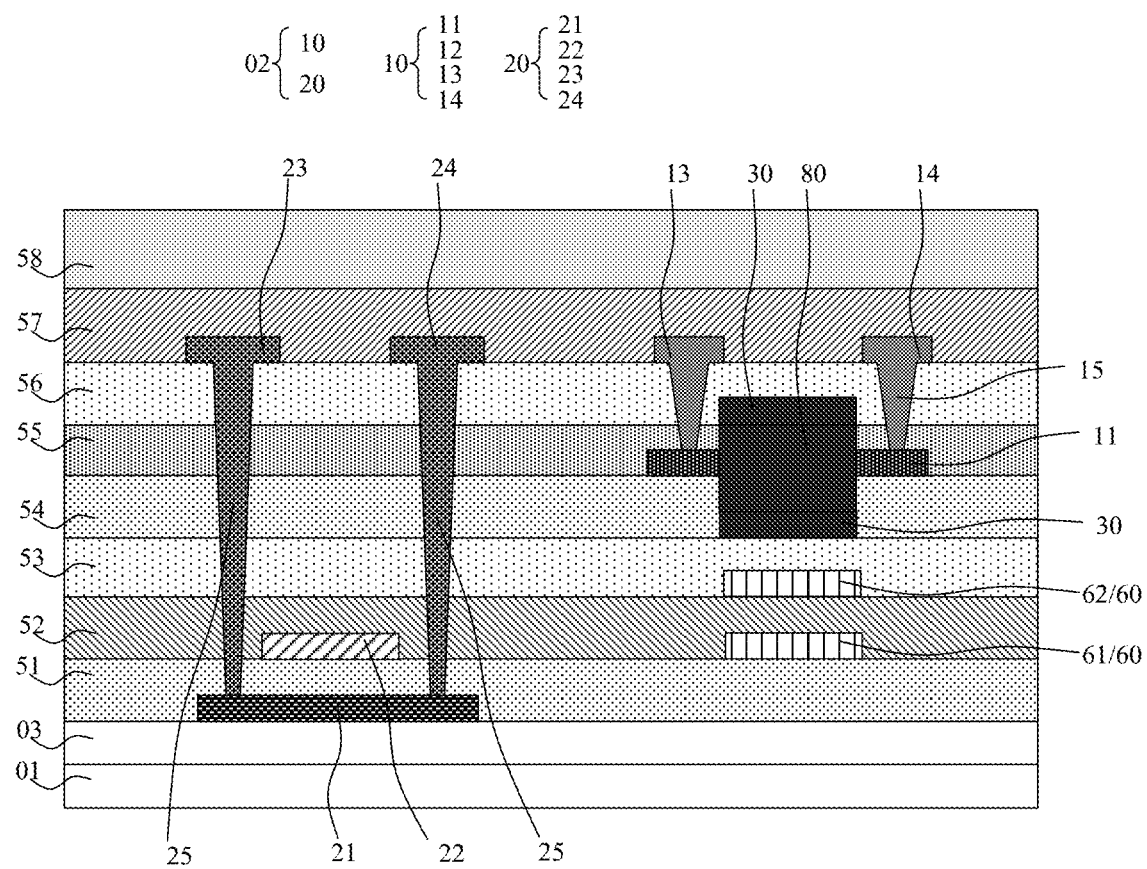
FIG. 26 illustrates another cross-sectional view along an A-A direction in FIG. 13.

In some embodiments, as shown in FIG. 25 and FIG. 26, the first active layer 11 may include a channel region 111, a source region 112 and a drain region located at two sides of the channel region 111 in the first direction X. The channel region 111 may be greatly affected by light and hydrogen. The first light blocking layer 30 and the second light blocking layer 80 may be disposed around the channel region 111 (the part of the first active layer 11 that is shielded by the second light blocking layer 80 in FIG. 14 is not shown). Exemplarily, the first light blocking layer 30 and the second light blocking layer 80 may be multiplexed as the first gate electrode 12 of the oxide transistor 10. Since the first light blocking layer 30 and the second light blocking layer 80 surrounds the channel region 111, the area of the first gate 12 may be increased, therefore enhancing the control ability of the first gate 12 and further improving the stability of the oxide transistor 10.

In some embodiments, the first light blocking layer 30 and the second light blocking layer 80 may be made of materials including non-metallic materials. The non-metallic material may include at least one of graphite, carbon nanotube, polypyrene, polyaniline, or a combination thereof. The above-mentioned non-metallic materials are all black materials. Therefore, the use of the above-mentioned materials for the first light blocking layer 30 and the second light blocking layer 80 can not only shield light, but also prevent hydrogen from diffusing into the channel region 111 of the first active layer 11.

In some other embodiments, the first light blocking layer 30 and the second light blocking layer 80 may be made of materials including metal materials that can shield light. The metal material may include at least one of titanium (Ti), aluminum (Al), molybdenum (Mo), or a combination thereof. When the first light blocking layer 30 and the second light blocking layer 80 are made of the above-mentioned metal material, the first light blocking layer 30 and the second light blocking layer 80 can not only play the role of shielding light and hydrogen, but also can be multiplexed as the gate 12 of the oxide transistor 10, therefore simplifying the film structure.

In some embodiments, the orthographic projection area of the first light blocking layer 30 on the substrate 01 may be larger than or equal to the orthographic projection area of the first active layer 11 on the substrate 01. For example, the display panel may be a top-emitting display panel, and the area of the first light blocking layer 30 may be set to be relatively large, to achieve better light blocking protection for the first active layer 11. For another example, the display panel may be a bottom-emitting display panel, and the area of the first light blocking layer 30 may be set to be relatively small to avoid affecting the light-emitting area of the display panel. For the bottom-emitting display panel, to avoid affecting the light-emitting area of the display panel and at the same time provide better light blocking protection for the first active layer 11, the orthographic projection area of the first light blocking layer 30 on the substrate 01 may be configured to be equal to the orthographic projection area of the first active layer 11 on the substrate 01.

Figure 27:
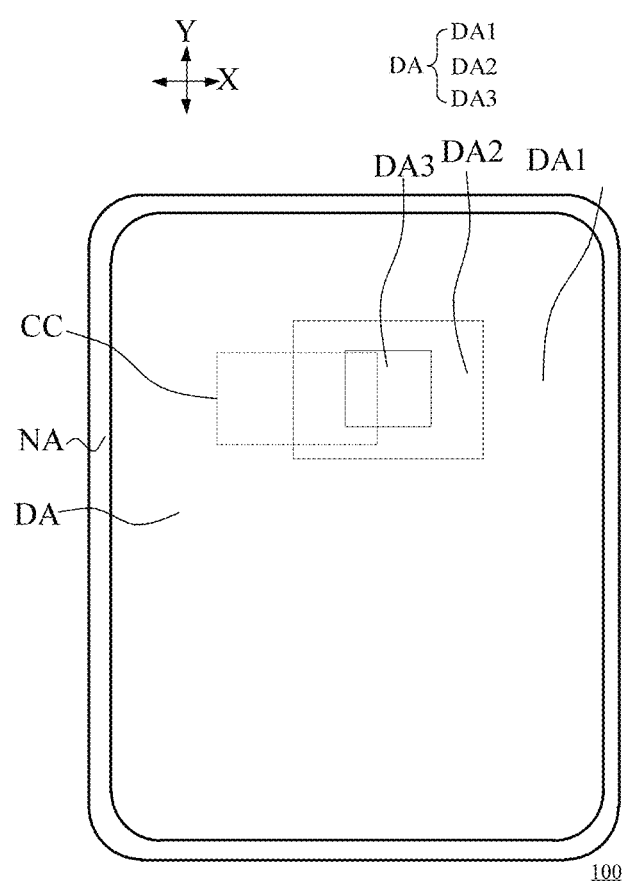
FIG. 27 illustrates a top view of another exemplary display panel consistent with various disclosed embodiments of the present disclosure.
Figure 28:
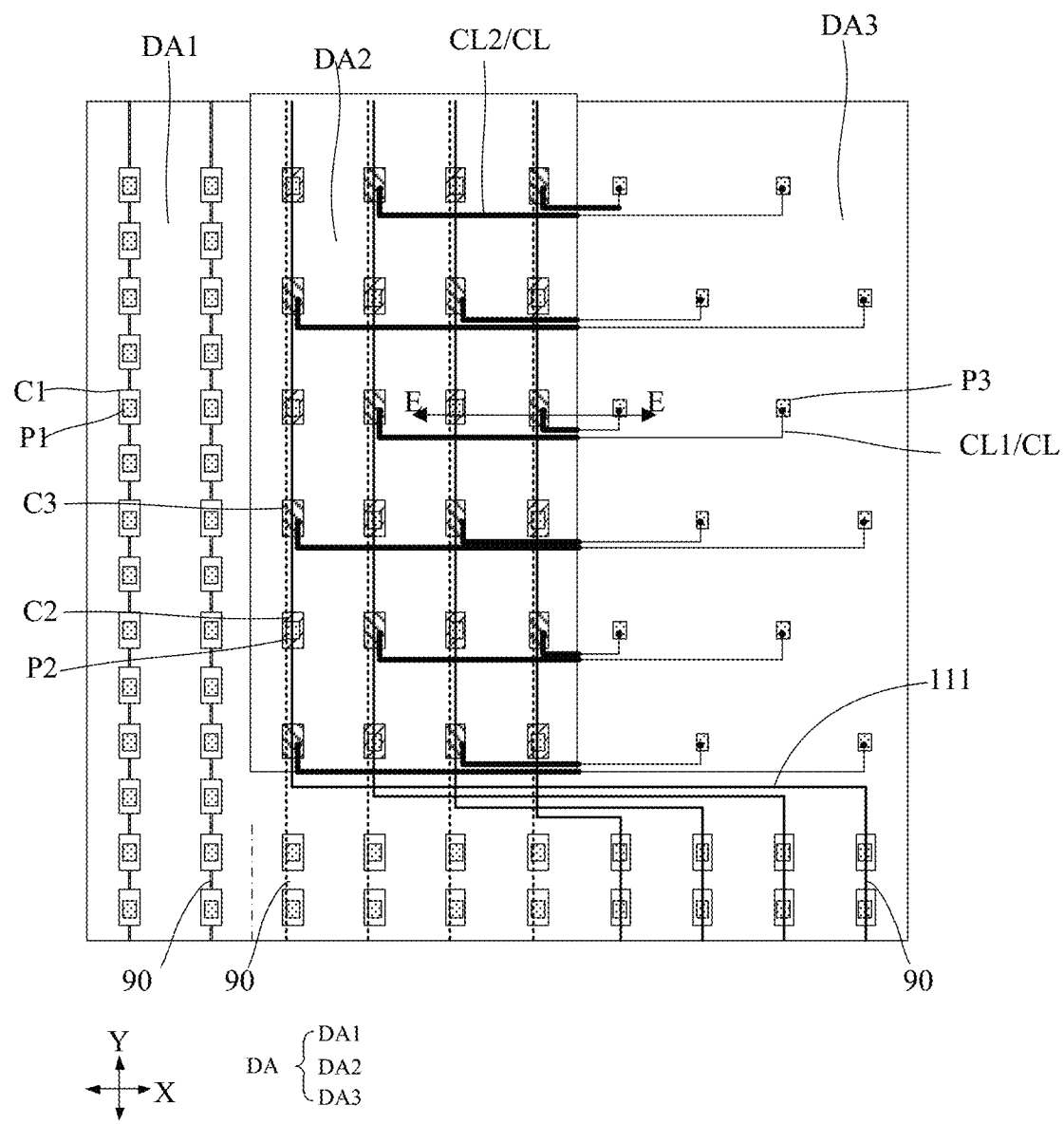
FIG. 28 illustrates a partially enlarged view of a C-C region in FIG. 27.
Figure 29:
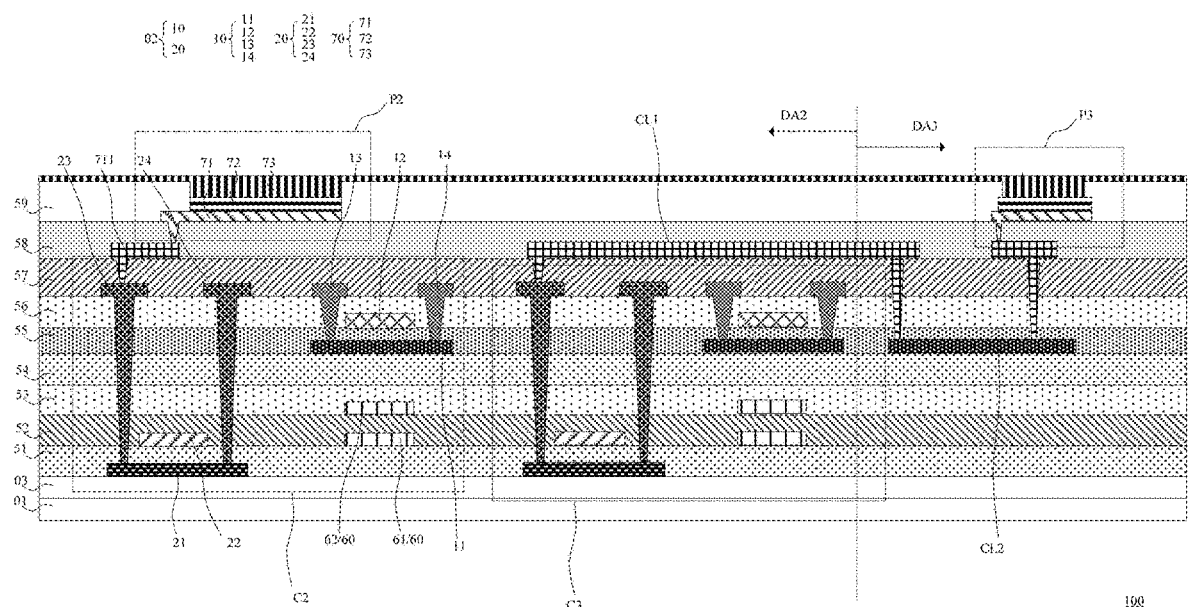
FIG. 29 illustrates a cross-sectional view along E-E in FIG. 28.

In some optional embodiments, as shown in FIG. 27 to FIG. 29, the display panel 100 may include a display area DA and a non-display area NA. The display area DA may include a plurality of data lines 90. The display area DA may include a first display area DA1, a second display area DA2 and a third display area DA3. The first display area DA1 may include a first driving circuit C1 and a first pixel P1. The second display area DA2 may include a second pixel P2, a second driving circuit C2, and a third driving circuit C3. The third display area DA3 may include a third pixel P3. The second driving circuit C2 may be electrically connected to the second pixel P2. The third driving circuit C3 and the third pixel P3 may be electrically connected through a connection structure CL, and the connection structure CL may include a first connector CL1 located in the second display area DA2 and a second connector CL2 located in the third display area DA3. Optionally, a part of the display area of the display panel, such as the third display area DA3, may be multiplexed as a photosensitive element integration area. At this time, photosensitive elements such as front cameras or infrared sensor elements may be arranged on the back of the photosensitive element integration area of the display panel, such light may pass through the photosensitive element integration area to the photosensitive element to achieve corresponding functions such as front camera and infrared sensing. The third driving circuit C3 connected to the third pixel P3 of the third display area DA3 may be disposed in the second display area DA2, such the third display area DA3 does not require any pixel circuit, improving the transmittance of the third display area.

Optionally, the second connector CL2 may be a transparent wiring, and the transparent wiring can increase the transmittance of the third display area DA3 and improve the light collection capability of the photosensitive elements.

Optionally, as shown in FIG. 27 to FIG. 29, the second connector CL2 and the first active layer 11 may be arranged in the same layer. The first active layer 11 may be made of a material including IGZO, and the transmittance of IGZO may be high, which can further increase the light transmittance of the third display area DA3 and improve the light collection capability of the photosensitive elements. Optionally, the second connector CL2 may include IGZO after conduction processing, which may reduce the transmission resistance of the second connector CL2 and improve the transmission capacity of the second connector CL2. Optionally, the second connecting component CL2 may be a curve.

Optionally, as shown in FIG. 29, the second pixel P2 may include an anode 71 located at the side of the driving circuit away from the substrate 01. The first connector CL1 and the anode 71 may be arranged on the same layer (not shown in the figure), and the first connector CL1 may be located in the second display area DA2. The first connector CL1 may not need to consider the transmittance of the second display area DA2. Correspondingly, the first connector CL1 and the anode 71 may be disposed in the same layer and may be made of a same material, such as ITO-Ag-ITO. The signal transmission capability of the first connector CL1 can be improved, and the film layers of the display panel may not need to be increased, which may save the costs.

Optionally, the oxide transistor 10 may include a first gate 12, a first source 13, and a first drain 14. The first gate 12 may be located at the side of the first active layer 11 away from the substrate 01. The first source 13 and the first drain 14 may be located at a side of the first gate 12 away from the substrate 01. The first light blocking layer 30 may be multiplexed as the first gate 12 in the first display area DA1 and the second display area DA2. The light blocking layer 30 may be multiplexed as the first gate 12, which may reduce the film layer of the display panel and simplify the process. At least part of the first connector CL1 may be arranged in the same layer as the first light blocking layer 30 or the first source 13 and the first drain 14, such that the first connector CL1 and the first light blocking layer 30 may be arranged in the same layer. In this embodiment, the first connector CL1, the first light blocking layer 30 and the first gate 12 may be highly integrated. On the one hand, the display panel film stack may be reduced, which is beneficial to realize the thinning of the display panel. On another hand, the first connector CL1 and the second connector CL2 may be arranged in different display areas and use different film layers, taking into account the signal transmission capability of the first connector CL1 in the second display area DA2 and the light transmission capacity of the second connector CL2 in the third display area DA3.

In some other embodiments, the display panel provided by the present disclosure may be a micro light-emitting diode (Micro LED) display panel, or a quantum dot display panel.

Figure 30:
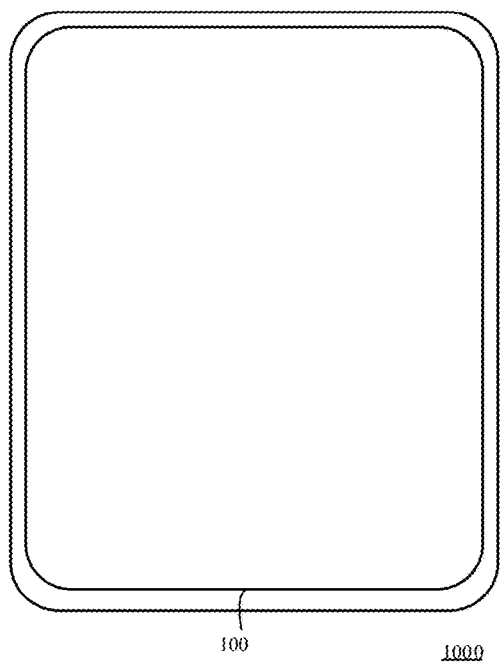
FIG. 30 illustrates an exemplary display device consistent with various disclosed embodiments of the present disclosure.

The present disclosure also provides a display device. The display device may include any display panel provided by various embodiments of the present disclosure. As shown in FIG. 30, the display device 1000 may include a display panel 100 provided by various embodiments of the present disclosure.

For description purposes only, the display device 1000 which is a cell phone is used as an example to illustrate the present disclosure, and should not limit the scope of the present disclosure. In other embodiments, the display device 1000 may be a computer, a television, a vehicle-mounted display device, or other display devices with display functions, which are not specifically limited in the present disclosure. The display device provided in the embodiments of the present disclosure may have the beneficial effects of the display panel provided in the embodiments of the present disclosure.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above-described embodiments, the present disclosure is not limited to the above described embodiments, but may be embodied in other equivalent forms without departing from the scope of the present disclosure, which is determined by the appended claims.

What is claimed is:

1. A display panel, comprising:
   a substrate;
   a driving circuit including an oxide transistor and a silicon transistor disposed on the substrate, wherein the oxide transistor includes a first active layer; and
   a first light blocking layer, wherein an orthographic projection of the first light blocking layer on the substrate at least overlaps an orthographic projection of the first active layer on the substrate; power signal lines, wherein: at least a portion of the power signal lines is disposed in a layer same as the first light blocking layer; the oxide transistor includes a first gate at a side of the first active layer away from the substrate; and the first light blocking layer is multiplexed as the first gate; wherein the power signal lines include: first sub power signal lines extending in a first direction and arranged in a second direction, and second sub power signal lines extending in the second direction and arranged in the first direction; the first sub power signal lines and the second sub power signal lines transmit same signals; the display panel further includes data signal lines; the data signal lines extend in the second direction and are arranged in the first direction; and the first sub power signal lines and the first light blocking layer are disposed in a same layer; wherein the second sub power signal lines include a first portion and a second portion; and in the first direction, the first portion at least does not overlap the second portion; a capacitor, wherein the second gate is disposed in a layer same as any electrode plate of the capacitor.

2. The display panel according to claim 1, further including a driving chip, wherein:
   at least a portion of the first light blocking layer is multiplexed as one of the power signal lines;
   a portion of the power signal lines far away from the driving chip is connected to the first light blocking layer; and
   another portion of the power signal lines close to the driving chip is not connected to the first light blocking layer.

3. The display panel according to claim 1, wherein:
   the data signal lines are disposed in a layer same as the second sub power signal lines.

4. The display panel according to claim 1, wherein:
   the first light blocking layer covers a source and a drain of the oxide transistor, and is multiplexed as a protective layer for the source and the drain of the oxide transistor.

5. The display panel according to claim 1, the capacitor is located between the first active layer and the substrate;
   the first light blocking layer is located at a side of the first active layer facing the substrate; and
   the first light blocking layer is multiplexed as an electrode plate of the capacitor.

6. The display panel according to claim 5, wherein:
   the first light block layer at the side of the first active layer facing the substrate includes a first light blocking sublayer and a second light blocking sublayer in stack;
   the first light blocking sublayer is located between the first active layer and the second light blocking layer;
   the first light blocking sublayer is multiplexed as an electrode plate of the capacitor; and the first light blocking sublayer is disposed in a layer same as a third gate, wherein the third gate is the gate of the silicon transistor.

7. The display panel according to claim 6, further including a buffer layer,
wherein:
the silicon transistor includes a second active layer;
the buffer layer is located between the second active layer and the substrate;
the second light blocking sublayer is located between the buffer layer and the substrate; and
an orthographic projection of the second light blocking sublayer on the substrate overlaps both an orthographic projection of the first active layer and an orthographic projection of the second active layer on the substrate.

8. The display panel according to claim 1, further including a light-emitting function layer, wherein:
the light-emitting function layer includes a first electrode, a light-emitting layer, and a second electrode that are stacked;
the first electrode is located at a side of the oxide transistor and the silicon transistor away from the substrate;
the light-emitting layer is located at a side of first electrode away from the substrate;
the second electrode is located at a side of the light-emitting layer away from the first electrode;
the first light blocking layer is located between the first electrode and the oxide transistor; and
the first light blocking layer is connected to the second electrode via a through hole.

9. The display panel according to claim 1, further including a second light blocking layer, wherein:
in a direction perpendicular to a light-emitting surface of the display panel, the second light blocking layer has a first cross-section;
the first cross-section intersects the substrate;
in a direction parallel to the light-emitting surface of the display panel, the second light blocking layer has a second cross-section; and
the second cross-section at least partially surrounds the oxide transistor.

10. The display panel according to claim 9, wherein:
in the direction perpendicular to the light-emitting surface of the display panel, a length of the first cross-section is larger than or equal to a distance from the source and drain of the oxide transistor to the first active layer.

11. The display panel according to claim 9, wherein:
the second light blocking layer is arranged in contact with the first light blocking layer; and
the first light blocking layer and the second light blocking layer are organic layers, or the first light blocking layer and the second light blocking layer are conductive structures and connected to a fixed electrical potential.

12. The display panel according to claim 1, wherein:
an area of an orthographic projection of the first light blocking layer on the substrate is larger than or equal to an area of an orthographic projection of the first active layer on the substrate.

13. The display panel according to claim 1, wherein:
the display panel includes a display area;
the display area includes a first display area, a second display area, and a third display area;

the first display area includes a first driving circuit and a first pixel, wherein the first driving circuit is electrically connected to the first pixel;
the second display area includes a second pixel, a second driving circuit, and a third driving circuit;
the third display area includes a third pixel;
the second driving circuit is electrically connected to the second pixel;
the third driving circuit is electrically connected to the third pixel through a connection structure;
the connection structure includes a first connector and a second connector; and
the first connector is located in the second display area and the second connector is located in the third display area.

14. The display panel according to claim 13, wherein:
the oxide transistor includes a first gate, a first source, and a first drain;
the first gate is located at a side of the first active layer away from the substrate;
the first source and the first drain are located at a side of the first gate away from the substrate;
in the first display area and the second display area, the first light blocking layer is multiplexed as the first gate; and
at least part of the first connector is disposed at a layer same as the first light blocking layer or the first source and the first drain.

15. A display device, comprising a display panel, wherein:
the display panel includes:
a substrate;
a driving circuit including an oxide transistor and a silicon transistor disposed at the substrate, wherein the oxide transistor includes a first active layer; and
a first light blocking layer, wherein an orthographic projection of the first light blocking layer on the substrate at least overlaps an orthographic projection of the first active layer on the substrate; power signal lines, wherein: at least a portion of the power signal lines is disposed in a layer same as the first light blocking layer; the oxide transistor includes a first gate at a side of the first active layer away from the substrate; and the first light blocking layer is multiplexed as the first gate; wherein the power signal lines include: first sub power signal lines extending in a first direction and arranged in a second direction, and second sub power signal lines extending in the second direction and arranged in the first direction; the first sub power signal lines and the second sub power signal lines transmit same signals; the display panel further includes data signal lines; the data signal lines extend in the second direction and are arranged in the first direction; and the first sub power signal lines and the first light blocking layer are disposed in a same layer; wherein the second sub power signal lines include a first portion and a second portion; and in the first direction, the first portion at least does not overlap the second portion; a capacitor, wherein the second gate is disposed in a layer same as any electrode plate of the capacitor.

* * * * *